(12) United States Patent
Amano et al.

(10) Patent No.: US 11,598,826 B2
(45) Date of Patent: Mar. 7, 2023

(54) MAGNETIC DETECTION DEVICE

(71) Applicant: Mitsubishi Electric Corporation, Tokyo (JP)

(72) Inventors: Tetsuo Amano, Tokyo (JP); Hideki Shimauchi, Tokyo (JP); Masahiro Yokotani, Tokyo (JP); Yoshinori Tatenuma, Tokyo (JP); Akira Koshimizu, Tokyo (JP)

(73) Assignee: Mitsubishi Electric Cornoration, Tokyo (JP)

( * ) Notice: Subject to any disclaimer, the term of this patent is extended or adjusted under 35 U.S.C. 154(b) by 147 days.

(21) Appl. No.: 17/028,524

(22) Filed: Sep. 22, 2020

(65) Prior Publication Data
US 2021/0286027 A1 Sep. 16, 2021

(51) Int. Cl.
*G01R 33/09* (2006.01)
*G01B 7/30* (2006.01)
(Continued)

(52) U.S. Cl.
CPC .............. *G01R 33/093* (2013.01); *G01B 7/30* (2013.01); *G01D 5/16* (2013.01); *G01P 3/44* (2013.01)

(58) Field of Classification Search
CPC .......... G01R 33/093; G01B 7/30; G01D 5/16; G01P 3/44
See application file for complete search history.

(56) References Cited

U.S. PATENT DOCUMENTS 6,937,010 B1    8/2005  Takashima et al.
7,923,993 B2 *  4/2011  Takahashi ............ G01D 5/2452
                                                          324/249
(Continued)

FOREIGN PATENT DOCUMENTS

DE    102004059374 A1    1/2006
DE       60222356 T2    5/2008
(Continued)

OTHER PUBLICATIONS

Communication dated Mar. 9, 2021, issued by the Japanese Patent Office in application No. 2020-040476.
(Continued)

*Primary Examiner* — Reena Aurora
(74) *Attorney, Agent, or Firm* — Sughrue Mion, PLLC; Richard C. Turner

(57) ABSTRACT

The magnetic detection device includes: a first magnetic rotary body which rotates about a rotation shaft and has an outer circumferential portion which is a magnetic body; a second magnetic rotary body has an outer circumferential portion which is a magnetic body; a magnet which has a magnetization direction along the axial direction; a first magneto-resistive element provided on another side in the axial direction of the magnet; a second magneto-resistive element provided on one side in the axial direction of the magnet; a first magnetic guide provided between the magnet and the first magneto-resistive element; and a second magnetic guide provided between the magnet and the second magneto-resistive element, wherein the outer circumferential portion of the first magnetic rotary body and the outer circumferential portion of the second magnetic rotary body cause different magnetic fields between the magnet and the respective outer circumferential portions.

16 Claims, 23 Drawing Sheets

(51) Int. Cl.
  *G01D 5/16*  (2006.01)
  *G01P 3/44*  (2006.01)

(56) References Cited

U.S. PATENT DOCUMENTS

| | | | |
|---|---|---|---|
| 10,234,263 B2* | 3/2019 | Chowdhury | G01L 5/221 |
| 10,732,194 B2* | 8/2020 | Hainz | G01P 3/487 |
| 2003/0062890 A1 | 4/2003 | Tokumoto | |
| 2010/0134095 A1 | 6/2010 | Loreit et al. | |
| 2010/0176799 A1 | 7/2010 | Ausserlechner | |
| 2012/0126797 A1 | 5/2012 | Kawano et al. | |
| 2016/0223360 A1 | 8/2016 | Yokotani et al. | |

FOREIGN PATENT DOCUMENTS

| | | |
|---|---|---|
| DE | 102009055130 A1 | 7/2010 |
| DE | 10 2011 104 009 A1 | 5/2012 |
| JP | 3-80322 U | 8/1991 |
| JP | 6-94475 A | 4/1994 |
| JP | 7-55416 A | 3/1995 |
| JP | 2002-090179 A | 3/2002 |
| JP | 2006-084416 A | 3/2006 |
| WO | 2015/056346 A1 | 4/2015 |

OTHER PUBLICATIONS

Communication dated Dec. 15, 2020, from the Japanese Patent Office in application No. 2020-040476.
Communication dated Apr. 20, 2021, from the German Patent and Trademark Office in application No. 102020213092.2.
Office Action dated Jul. 6, 2021 in German Application No. 10 2020 213 092.2.

* cited by examiner

MAGNETIC DETECTION DEVICE

BACKGROUND OF THE INVENTION

1. Field of the Invention

The present disclosure relates to a magnetic detection device.

2. Description of the Background Art

For a device that detects the rotation speed or the rotation angle of a rotary body, for example, a device that detects a magnetic field changing through rotation with elapse of time is used as a magnetic detection device.

In a control system for a vehicle engine or the like, it is required to obtain two types of different signal patterns from a rotary body attached to one shaft. The vehicle engine is normally controlled by the system on the basis of position information of a crankshaft, for example. Providing plural kinds of position information of the crankshaft enables the engine control to be performed more accurately. As a configuration of a magnetic detection device for obtaining two types of different signal patterns from one rod moving in one direction, disclosed is a configuration having two tooth structures that are detection targets, two magnetic sensors for detecting changes in magnetic fields due to movements of the tooth structures, and one magnet for applying a bias magnetic field to the two magnetic sensors (see, for example, Patent Document 1, FIG. 7). In this magnetic detection device, the two tooth structures formed from magnetic bodies are provided to one rod. As the magnetic sensors, magneto-electric conversion elements such as magneto-resistive elements are used, and each magnetic sensor detects change in a magnetic field generated due to movement of the rod.

Patent Document 1: US Patent application publication No. 2010/0134095

In Patent Document 1, the two magneto-resistive elements detect respective changes in different magnetic fields generated between the magnet and the two tooth structures formed from magnetic bodies. Thus, it is possible to obtain two types of different signal patterns from the two tooth structures provided to the rod moving in one direction. However, in the case where each of the two magneto-resistive elements detects one tooth structure opposed thereto, change in the magnetic field due to the other tooth structure that is not opposed thereto also influences one magneto-resistive element, thus causing a problem that erroneous detection occurs in the one magneto-resistive element, so that detection accuracy deteriorates. For example, in the case where the two tooth structures are close to each other, the case where the sizes of the two tooth structures are different, or the case where one magneto-resistive element is close to the other tooth structure which is not a detection target, one magneto-resistive element is influenced by not only one tooth structure that is a detection target but also the other tooth structure that is not a detection target.

As methods for preventing an influence from being given by the other magnetic-body tooth structure that is not a detection target, there are a method in which the interval between the two tooth structures is expanded to increase the distance between the two magneto-resistive elements, and a method in which a magnetic volume of the other tooth structure relative to one tooth structure is reduced to reduce the influence of the other tooth structure on the one magneto-resistive element. However, if the distance between the two magneto-resistive elements is increased, there are a problem that the size of the magnetic detection device increases, and a problem that layout convenience when the magnetic detection device is mounted to an engine or the like is lowered due to size increase. Meanwhile, if a magnetic volume of the other tooth structure relative to one magneto-resistive element is reduced, the amplitude of an output signal from the other magneto-resistive element which detects the other tooth structure is reduced, thus causing a problem that detection accuracy of the other tooth structure is deteriorated. It is noted that the above methods for preventing an influence from being given by the other tooth structure that is not a detection target, and problems caused by the respective methods, are the same also in the relationship between the other magneto-resistive element and one tooth structure.

SUMMARY OF THE INVENTION

Considering the above, an object of the present disclosure is to provide a magnetic detection device in which change in a magnetic field due to a magnetic body that is a detection target of one magneto-resistive element is inhibited from influencing the other magneto-resistive element, while size increase is suppressed.

A magnetic detection device according to the present disclosure includes: a first magnetic rotary body which rotates about a rotation shaft and has an outer circumferential portion which is a magnetic body; a second magnetic rotary body which is provided on one side in an axial direction with respect to the first magnetic rotary body and rotates integrally with the first magnetic rotary body, the second magnetic rotary body having an outer circumferential portion which is a magnetic body; a magnet provided radially outward of the first magnetic rotary body and the second magnetic rotary body and fixed to a non-rotary member, the magnet having a magnetization direction along the axial direction; a first magneto-resistive element which is provided on another side in the axial direction of the magnet and detects change in a magnetic field; a second magneto-resistive element which is provided on one side in the axial direction of the magnet and detects change in a magnetic field; a first magnetic guide provided between the magnet and the first magneto-resistive element; and a second magnetic guide provided between the magnet and the second magneto-resistive element, wherein the outer circumferential portion of the first magnetic rotary body and the outer circumferential portion of the second magnetic rotary body cause different magnetic fields between the magnet and the respective outer circumferential portions.

In the magnetic detection device according to the present disclosure, the first magnetic guide is provided between the magnet and the first magneto-resistive element, and the second magnetic guide is provided between the magnet and the second magneto-resistive element. Thus, the influence caused by change in the magnetic field due to the second magnetic rotary body on the first magneto-resistive element provided on the other side in the axial direction of the magnet, and the influence caused by change in the magnetic field due to the first magnetic rotary body on the second magneto-resistive element provided on the one side in the axial direction of the magnet, can be reduced. In addition, since the influence on the first magneto-resistive element caused by change in the magnetic field due to the second magnetic rotary body and the influence on the second magneto-resistive element caused by change in the magnetic field due to the first magnetic rotary body are reduced, it is possible to accurately detect changes in the magnetic fields due to the first magnetic rotary body and the second magnetic rotary body.

DETAILED DESCRIPTION OF THE PREFERRED EMBODIMENTS OF THE INVENTION

Figure 1:
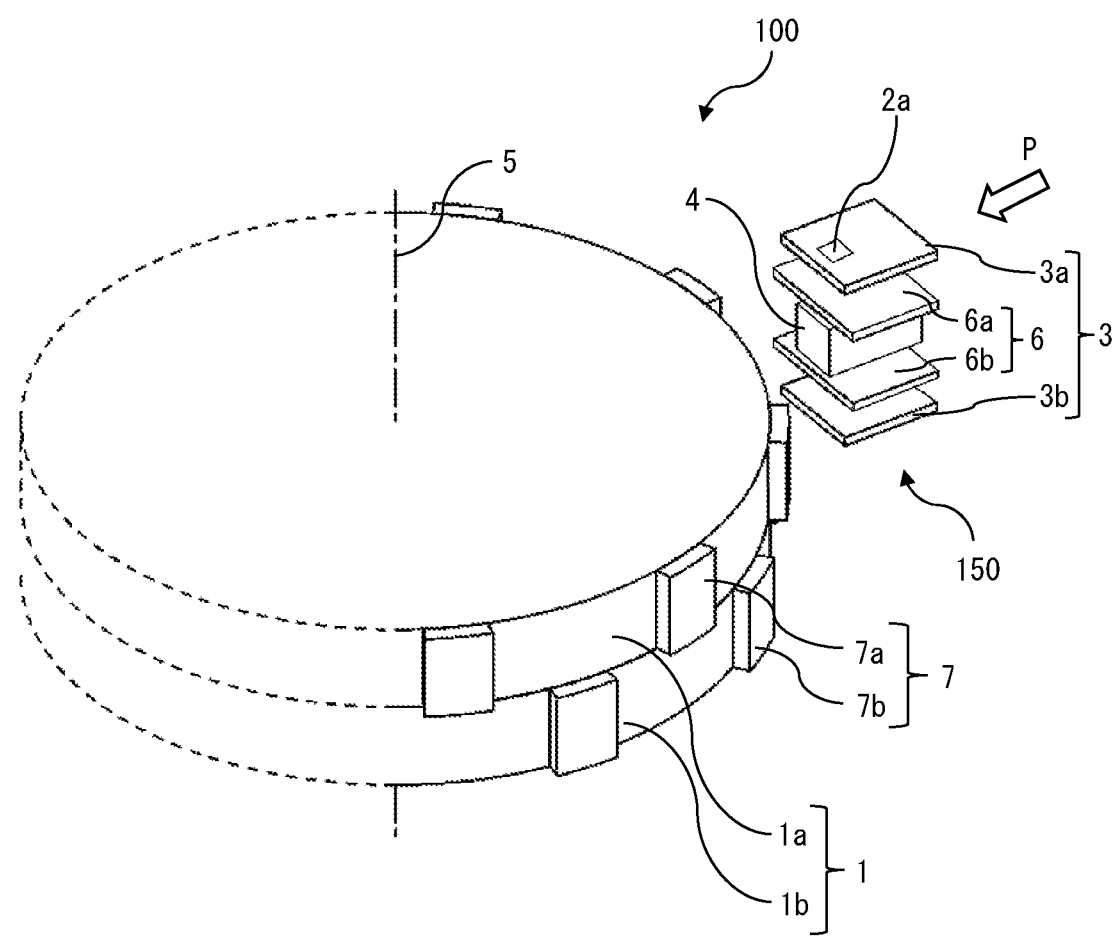
FIG. 1 is a perspective view schematically showing the structure of a magnetic detection device according to the first embodiment of the present disclosure.

Hereinafter, a magnetic detection device according to embodiments of the present disclosure will be described with reference to the drawings. In the drawings, the same or corresponding members/parts are denoted by the same reference characters, to give description.

First Embodiment

Figure 2:
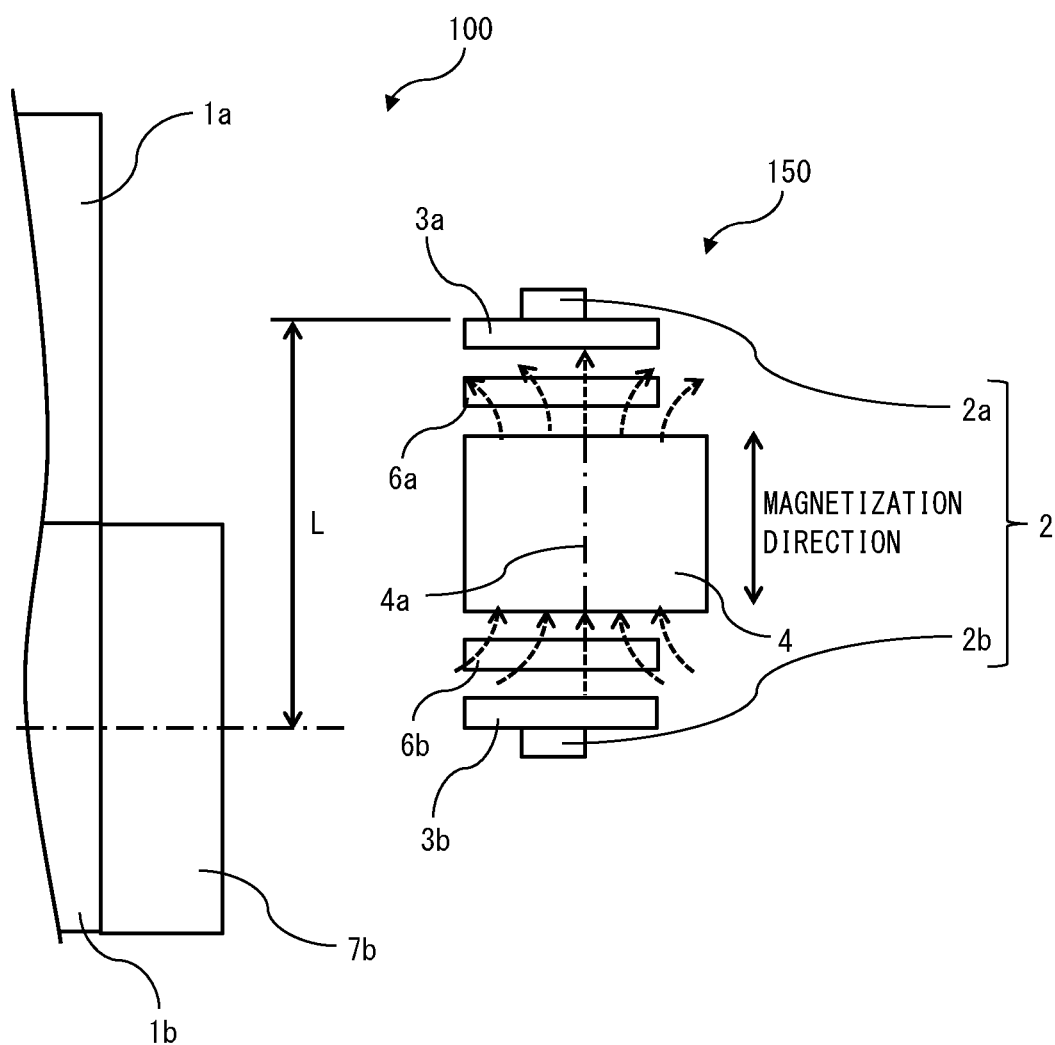
FIG. 2 is a side view of a detection unit of the magnetic detection device according to the first embodiment.
Figure 3:
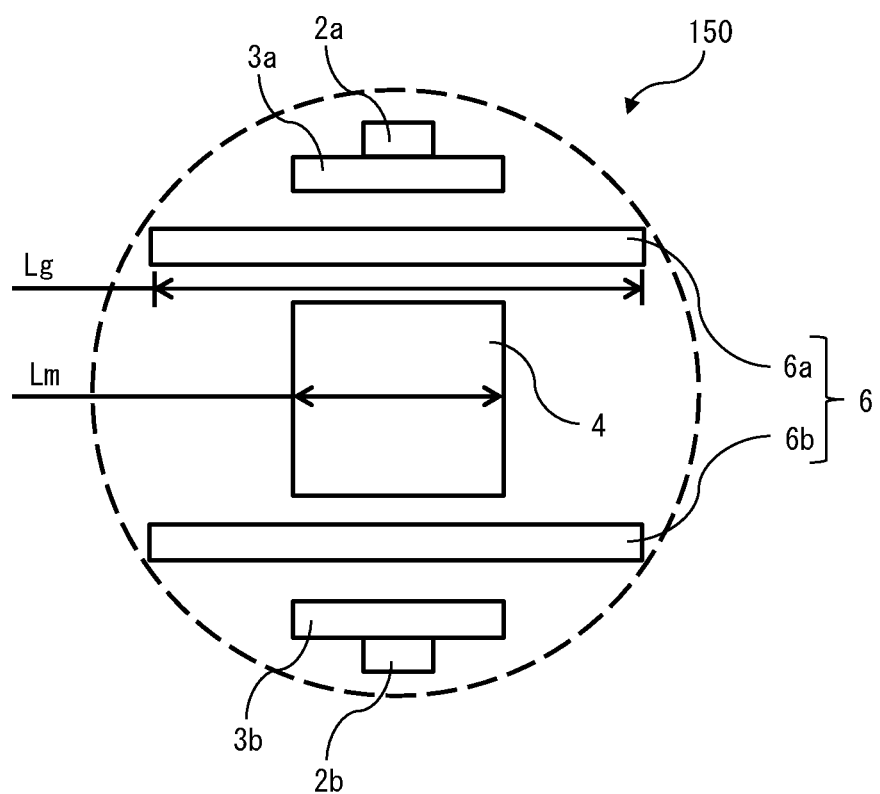
FIG. 3 is another side view of the detection unit of the magnetic detection device according to the first embodiment.
Figure 4:
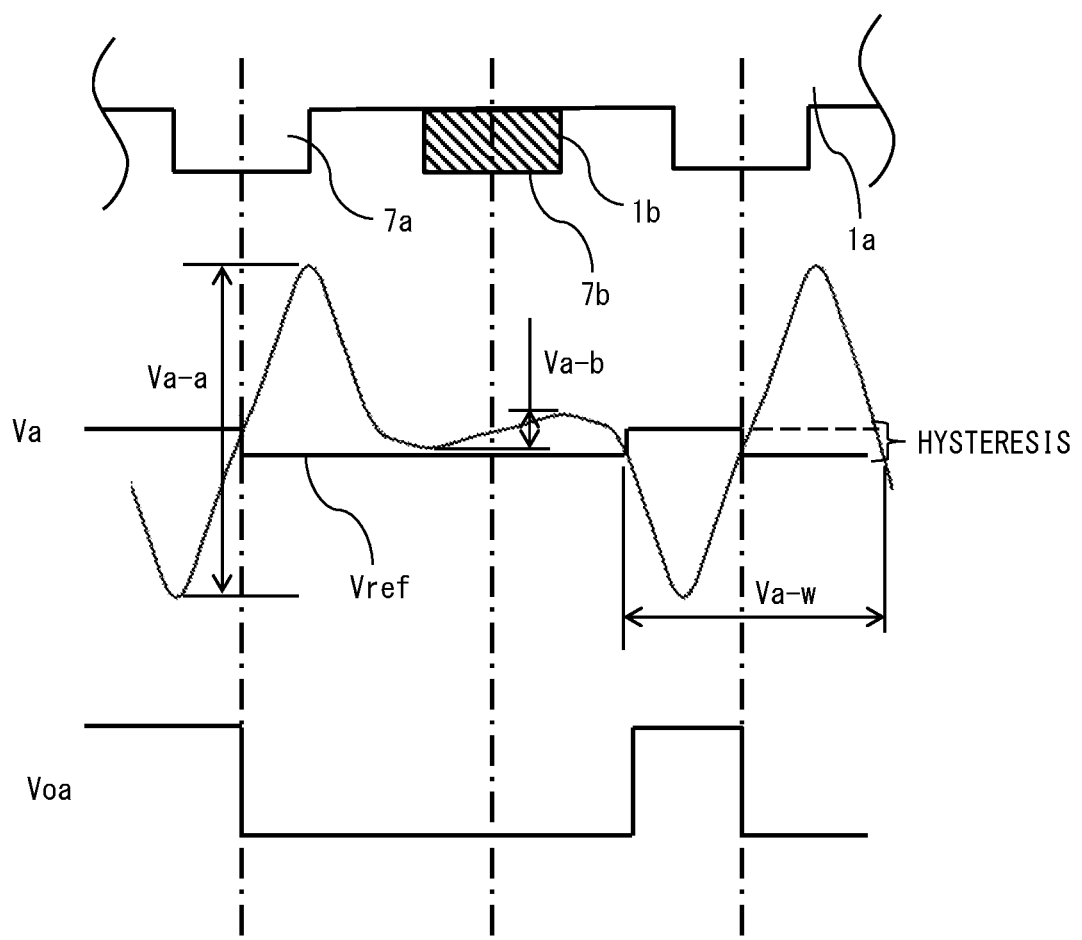
FIG. 4 is a timing chart showing operation of the magnetic detection device according to the first embodiment.
Figure 5:
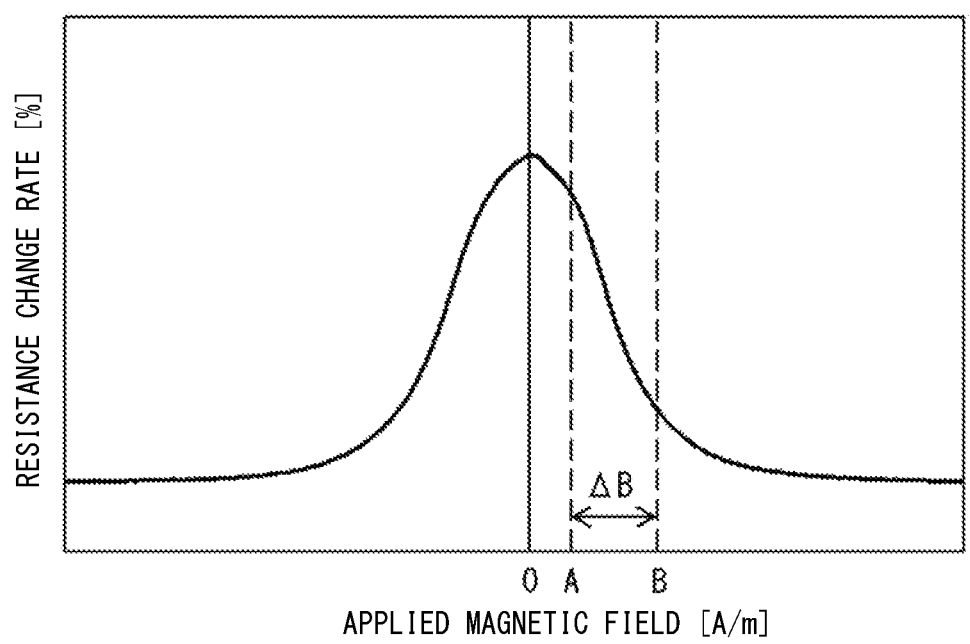
FIG. 5 is a graph showing an MR loop of a first magneto-resistive element of the magnetic detection device according to the first embodiment.
Figure 6:
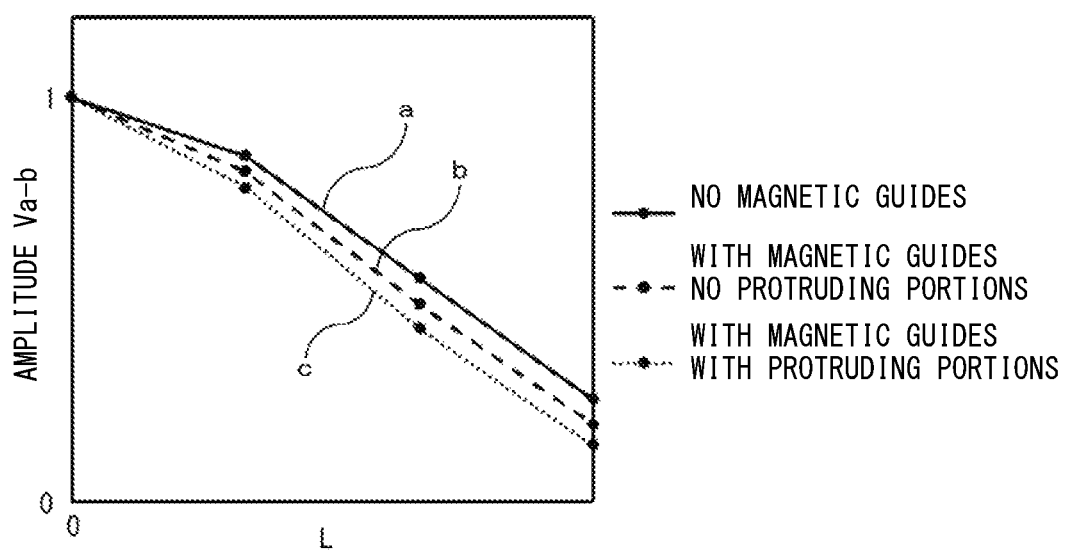
FIG. 6 is a graph showing effects obtained by providing magnetic guides in the magnetic detection device according to the first embodiment.
Figure 7:
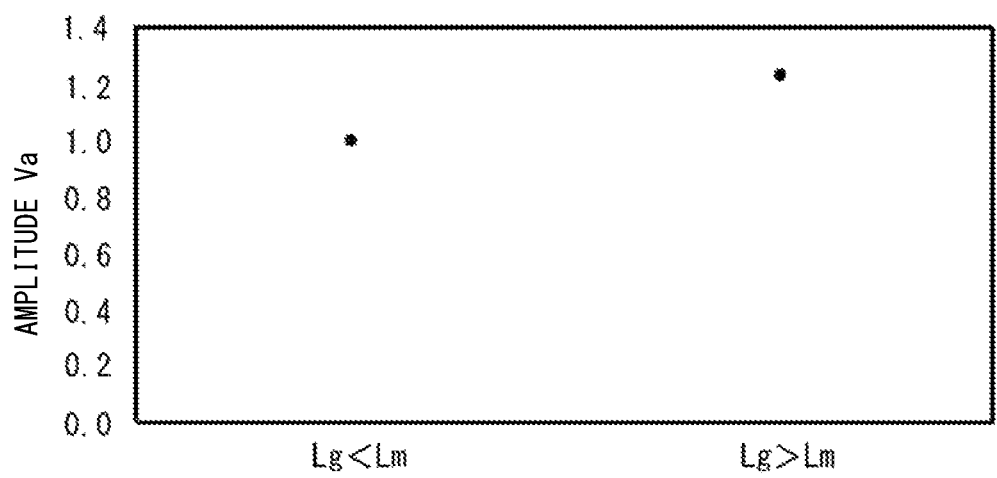
FIG. 7 shows the relationship between the circumferential-direction widths of the magnetic guides and the magnet in the magnetic detection device according to the first embodiment.

FIG. 1 is a perspective view schematically showing the structure of a magnetic detection device 100 according to the first embodiment of the present disclosure, FIG. 2 is a side view of a detection unit 150 of the magnetic detection device 100, FIG. 3 is a side view of the detection unit 150 of the magnetic detection device 100 as seen in the direction of arrow P in FIG. 1, FIG. 4 is a timing chart showing operation of the magnetic detection device 100, FIG. 5 is a graph showing an MR loop of a first magneto-resistive element 2a of the magnetic detection device 100, FIG. 6 is a graph showing effects of magnetic guides 6 of the magnetic detection device 100, and FIG. 7 shows the relationship between the circumferential-direction widths of the magnetic guide 6 and the magnet 4 of the magnetic detection device 100. The magnetic detection device 100 is a device for obtaining two types of different signal patterns from a first magnetic rotary body 1a and a second magnetic rotary body 1b that rotate about a rotation shaft 5. The rotation shaft 5 is, for example, a crankshaft or a wheel shaft of an engine, or a rotary shaft attached thereto.

<Summary of Structure of Magnetic Detection Device 100>

The magnetic detection device 100 includes two magnetic rotary bodies 1 and the detection unit 150. The detection unit 150 includes two magneto-resistive elements 2, two processing circuits 3, two magnetic guides 6, and one magnet 4. The magnetic rotary bodies 1 and the magnetic guides 6 are made of, for example, SPCC which is cold-rolled steel. The material of the magnet 4 is, for example, samarium-cobalt. The first magnetic rotary body 1a rotates about the rotation shaft 5, and has an outer circumferential portion which is a magnetic body. The second magnetic rotary body 1b is provided on one side in the axial direction with respect to the first magnetic rotary body 1a, rotates integrally with the first magnetic rotary body 1a, and has an outer circumferential portion which is a magnetic body. The magnet 4 has a rectangular parallelepiped shape, is provided radially outward of the first magnetic rotary body 1a and the second magnetic rotary body 1b, and has a magnetization direction along the axial direction. A magnetic flux indicated by, for example, broken-line arrows in FIG. 2 is generated from the magnet 4. The magnet 4 applies a bias magnetic field to the first magneto-resistive element 2a and the second magneto-resistive element 2b. In the magnetic detection device 100 for detecting the magnetic rotary bodies 1 attached to, for example, a crankshaft, the detection unit 150 including the magnet 4 is fixed to an engine block (not shown) which is a non-rotary member.

The outer circumferential portion of the first magnetic rotary body 1a and the outer circumferential portion of the second magnetic rotary body 1b each have a plurality of protrusions 7 arranged at predetermined intervals in the circumferential direction. In FIG. 1, the protrusions 7 on a half side of the outer circumferential portions of the first magnetic rotary body 1a and the second magnetic rotary body 1b are not shown. The plurality of protrusions 7a of the first magnetic rotary body 1a and the plurality of protrusions 7b of the second magnetic rotary body 1b are located at positions different from each other in the circumferential direction. The protrusions 7a and the protrusions 7b which are parts of the outer circumferential portions of the first magnetic rotary body 1a and the second magnetic rotary body 1b are also magnetic bodies. The outer circumferential portion of the first magnetic rotary body 1a and the outer circumferential portion of the second magnetic rotary body 1b cause different magnetic fields between the magnet 4 and the respective outer circumferential portions. In addition, through rotation of the first magnetic rotary body 1a and the second magnetic rotary body 1b, the outer circumferential portion of the first magnetic rotary body 1a and the outer circumferential portion of the second magnetic rotary body 1b cause differently changing magnetic fields between the magnet 4 and the respective outer circumferential portions.

The first magneto-resistive element 2a is located perpendicularly to the axial direction and on the other side in the axial direction of the magnet 4, and detects change in a magnetic field. The second magneto-resistive element 2b is located perpendicularly to the axial direction and on one side in the axial direction of the magnet 4, and detects change in a magnetic field. The magnetic pole surfaces of the magnet 4 are respectively parallel to the first magneto-resistive element 2a and the second magneto-resistive element 2b. A first processing circuit 3a is connected to the first magneto-resistive element 2a, processes an output from the first magneto-resistive element 2a, and outputs the processing result to outside. The second processing circuit 3b is connected to the second magneto-resistive element 2b, processes an output from the second magneto-resistive element 2b, and outputs the processing result to outside. A first magnetic guide 6a formed from a magnetic body is located between the magnet 4 and the first magneto-resistive element 2a. A second magnetic guide 6b formed from a magnetic body is located between the magnet 4 and the second magneto-resistive element 2b. The first magnetic guide 6a and the second magnetic guide 6b are formed in rectangular plate shapes. However, the first magnetic guide 6a and the second magnetic guide 6b are not limited to these shapes, and may have any shapes serving as shields between the magnet 4 and the magneto-resistive elements 2.

<Magneto-Resistive Elements 2>

The magneto-resistive elements 2 are elements of which resistance values change in accordance with the intensity of a magnetic field applied in a direction along the element surface inside. Each magneto-resistive element 2 is located on the magnetic rotary body 1 side in the radial direction with respect to a center axis 4a in the magnetization direction of the magnet 4 so that a bias magnetic field is applied in a direction along the element surface inside. In FIG. 5, the horizontal axis indicates a magnetic field (A/m) applied to the first magneto-resistive element 2a, and the vertical axis indicates a resistance change rate (%) of the first magneto-resistive element 2a. FIG. 5 shows an MR loop of the first magneto-resistive element 2a, and the same MR loop is exhibited also for the second magneto-resistive element 2b. As shown in FIG. 5, in the first magneto-resistive element 2a, resistance change with respect to the applied magnetic field is nonlinear. Therefore, in order to use a region that is close to a linear shape and has a great resistance change rate in the MR loop, for example, it is desirable to make setting so that a magnetic field corresponding to a region of ΔB in FIG. 5 is applied to the first magneto-resistive element 2a. Specifically, the following setting is made. A bias magnetic field corresponding to A in FIG. 5 is applied to the first magneto-resistive element 2a. Then, when the distance between the protrusion 7a and the first magneto-resistive element 2a is minimized, a magnetic field corresponding to B in FIG. 5 is applied to the first magneto-resistive element 2a. Such setting can be made by adjusting the positional relationship among the magneto-resistive elements 2, the magnetic guides 6, and the magnet 4. It is noted that, since the MR loop has line-symmetric characteristic, even if the direction of the applied magnetic field is reversed, the characteristic of the magneto-resistive element 2 is the same.

Comparative Example

Figure 19:
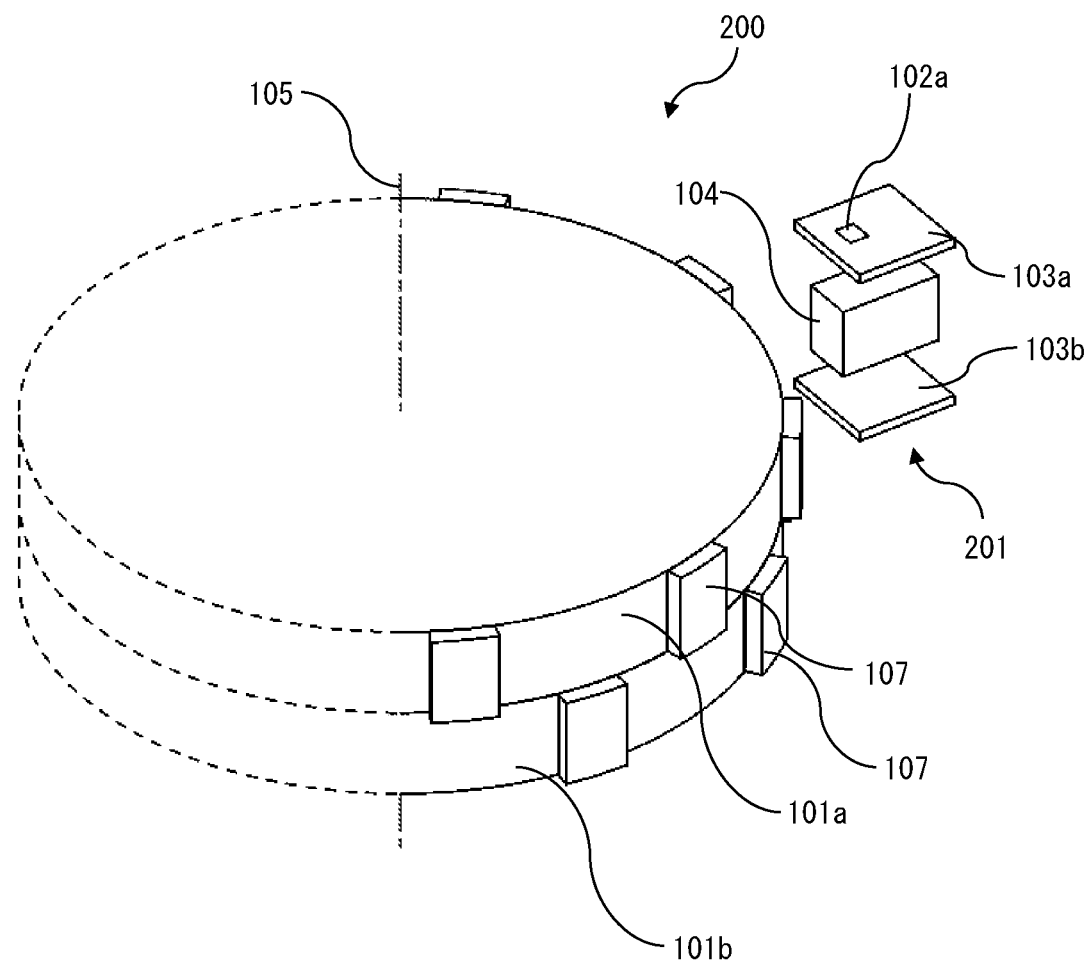
FIG. 19 is a perspective view schematically showing the structure of a magnetic detection device in a comparative example.
Figure 20:
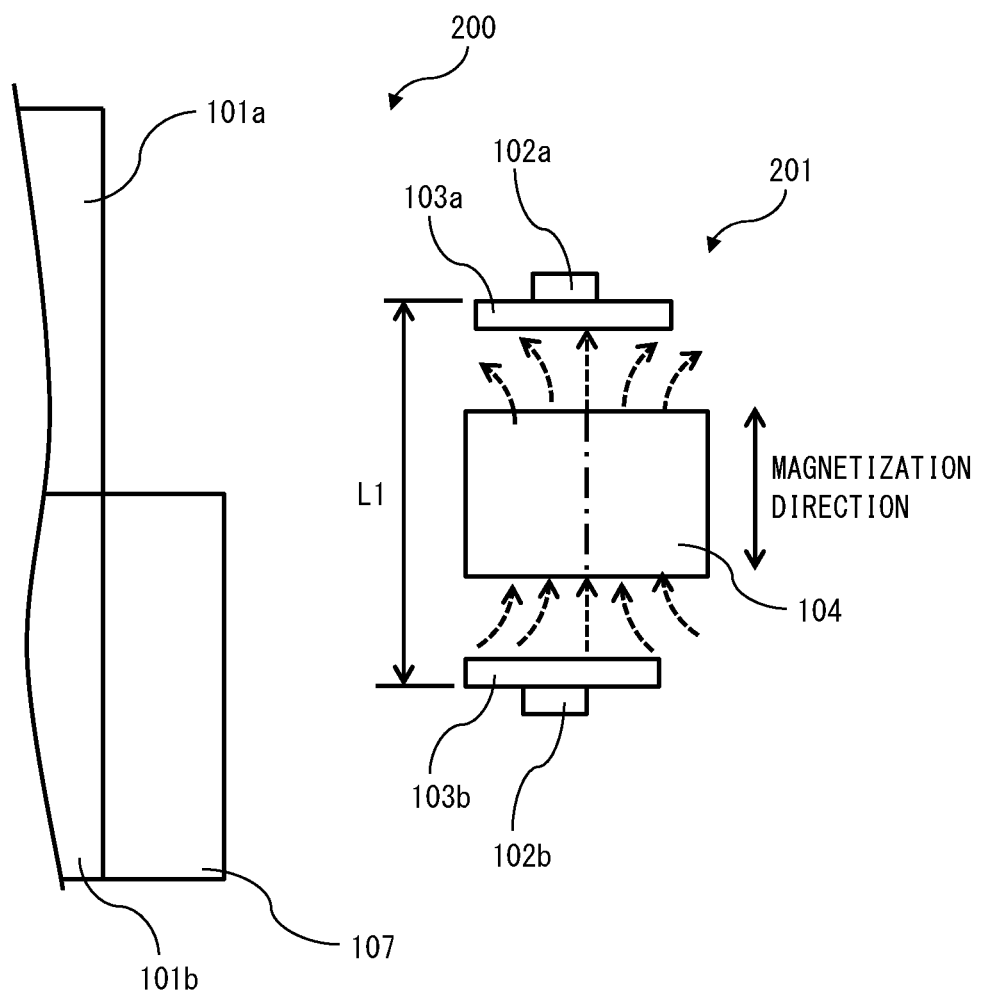
FIG. 20 is a side view of a detection unit of the magnetic detection device in the comparative example.

Before description of the magnetic guides 6 which are major part of the present disclosure, a comparative example will be described with reference to FIG. 19 and FIG. 20. FIG. 19 is a perspective view schematically showing the structure of a magnetic detection device 200 in the comparative example, and FIG. 20 is a side view of a detection unit 201 of the magnetic detection device 200 shown in FIG. 19. The magnetic detection device 200 includes magnetic rotary bodies 101a, 101b, magneto-resistive elements 102a, 102b which are detection elements, processing circuits 103a, 103b, and a magnet 104. The magnetic rotary bodies 101a, 101b having outer circumferential portions which are magnetic bodies rotate in synchronization with rotation of a rotation shaft 105. The outer circumferential portions of the magnetic rotary bodies 101a, 101b each have a plurality of protrusions 107 arranged at predetermined intervals in the circumferential direction. The outer circumferential portions of the magnetic rotary bodies 101a, 101b are different in the positions of their protrusions 107. The magnet 104 has a rectangular parallelepiped shape, has a magnetization direction along the axial direction, and is located radially outward of the magnetic rotary bodies 101a, 101b. The magneto-resistive elements 102a, 102b detect changes in magnetic fields generated between the magnet 104 and the magnetic rotary bodies 101a, 101b. The magneto-resistive elements 102a, 102b are located on planes perpendicular to the rotation shaft 105, correspondingly for the respective outer circumferential portions of the magnetic rotary bodies 101a, 101b, and are respectively located on one side and the other side in the axial direction of the magnet 104. The magnet 104 applies a bias magnetic field to each of the magneto-resistive elements 102a, 102b. The processing circuits 103a, 103b are connected to the respective magneto-resistive elements 102a, 102b, and process the respective outputs from the magneto-resistive elements 102a, 102b.

Figure 21:
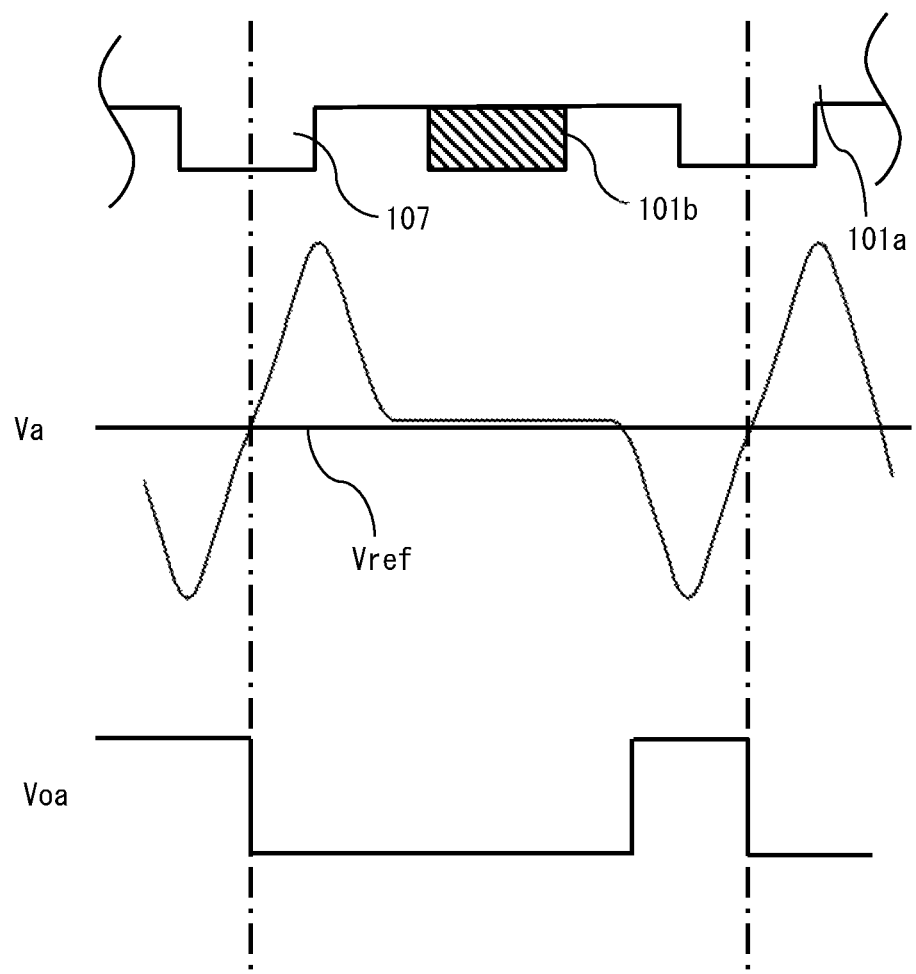
FIG. 21 is a timing chart illustrating operation of the magnetic detection device in the comparative example.
Figure 22:
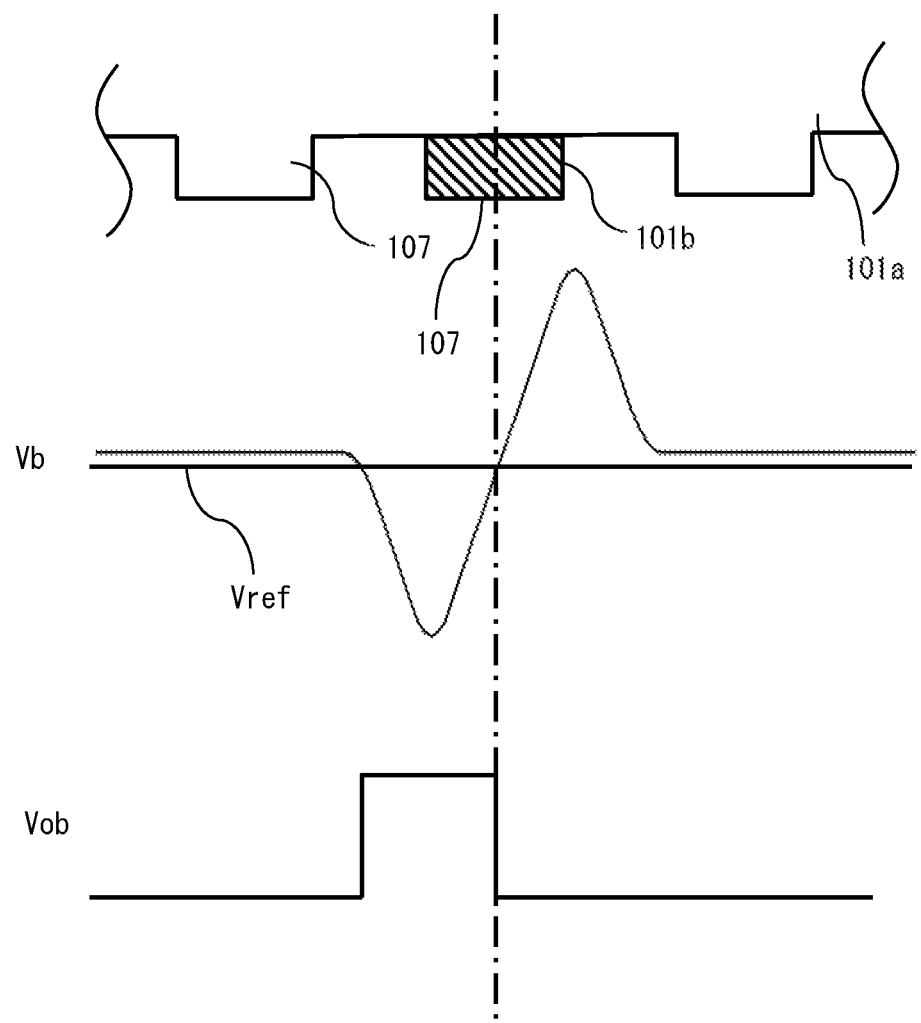
FIG. 22 is a timing chart illustrating operation of the magnetic detection device in the comparative example.

FIG. 21 and FIG. 22 are timing charts showing operation of the magnetic detection device 200 in the comparative example. FIG. 21 shows output of the magneto-resistive element 102a in the case where the magneto-resistive element 102a is not influenced by the magnetic rotary body 101b not opposed thereto, and FIG. 22 shows output of the magneto-resistive element 102b in the case where the magneto-resistive element 102b is not influenced by the magnetic rotary body 101a not opposed thereto. In FIG. 21, Va indicates an output signal of the magneto-resistive element 102a, and in FIG. 22, Vb indicates an output signal of the magneto-resistive element 102b. While the magnetic rotary bodies 101a, 101b rotate about the rotation shaft 105, magnetic fields applied to the magneto-resistive elements 102a, 102b change in accordance with the shapes of the outer circumferential portions of the magnetic rotary bodies 101a, 101b. In response to the changes in the magnetic fields, the output signals Va, Vb of the magneto-resistive elements 102a, 102b change. By performing binarizing processing on the output signals Va, Vb using an appropriate threshold Vref, rectangular wave signals Voa, Vob corresponding to arrangements of the protrusions 107 provided on the outer circumferential portions of the magnetic rotary bodies 101a, 101b are obtained. As shown in FIG. 21 and FIG. 22, by providing the two magneto-resistive elements 102a, 102b for the two magnetic rotary bodies 101a, 101b and performing detection, it is possible to obtain the rectangular wave signals Voa, Vob indicating two different signal patterns from one rotation shaft 105.

Figure 23:
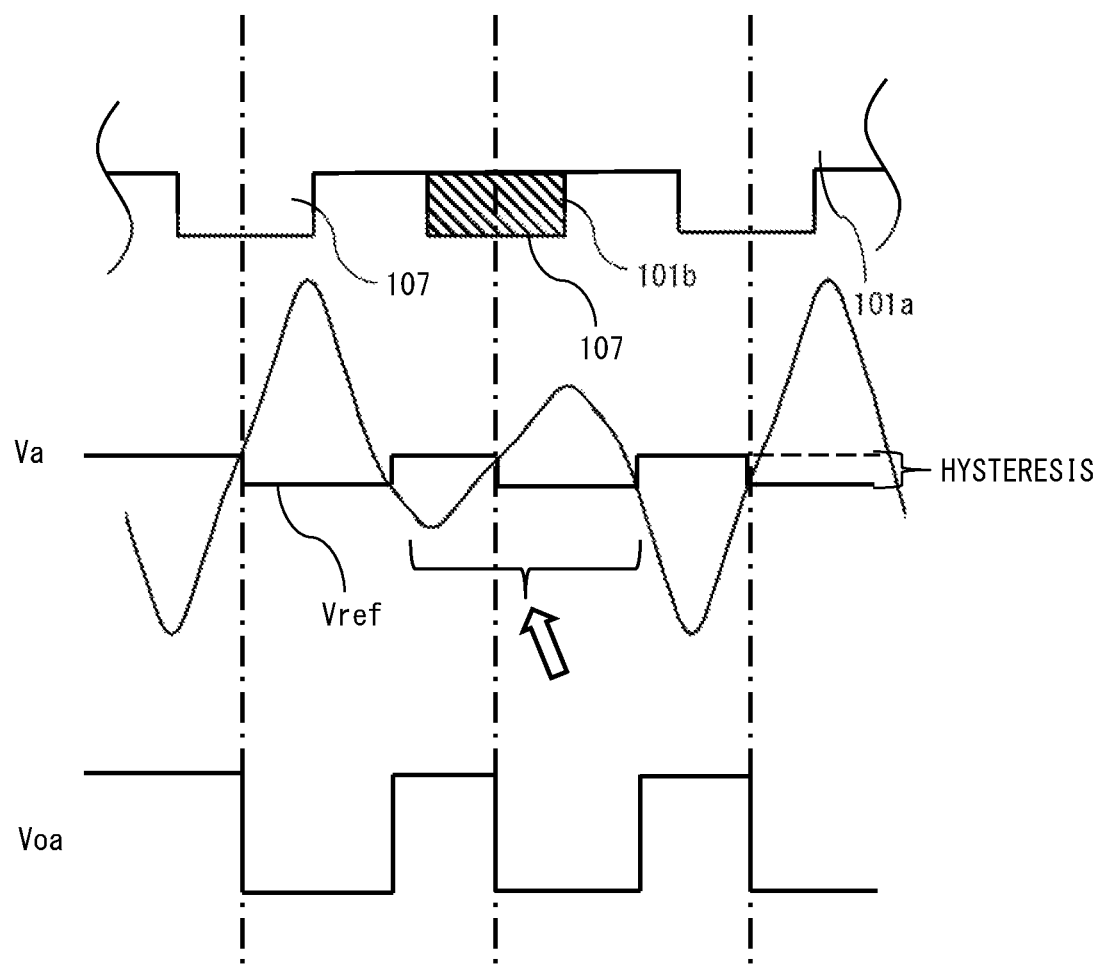
FIG. 23 is another timing chart illustrating operation of the magnetic detection device in the comparative example.

FIG. 23 is another timing chart showing operation of the magnetic detection device 200 in the comparative example. FIG. 23 shows output of the magneto-resistive element 102a in the case where the magneto-resistive element 102a is influenced by the magnetic rotary body 101b not opposed thereto. FIG. 23 shows output in the case where the magnetic rotary body 101a and the magnetic rotary body 101b are close to each other as shown in FIG. 20 and accordingly a distance L1 between the magneto-resistive element 102a and the magneto-resistive element 102b is small. In the case where the distance L1 is small, the magneto-resistive element 102a detects not only one magnetic rotary body 101a opposed thereto, but also the other magnetic rotary body 101b. As shown at a part indicated by a center arrow in FIG. 23, change due to the protrusion 107 of the magnetic rotary body 101b occurs in the output signal Va of the magneto-resistive element 102a. In this case, if binarizing processing is performed using a constant threshold Vref as shown in FIG. 21 and FIG. 22, not only a signal due to the magnetic rotary body 101a but also a signal due to the magnetic rotary body 101b is generated in the rectangular wave signal Voa. Therefore, when magnetic fields are changed due to respective rotations of the two magnetic rotary bodies, in each of the two magneto-resistive elements that detect the respective two magnetic rotary bodies, change in the magnetic field due to the other magnetic rotary body which is not a detection target occurs.

In order to avoid such a situation, there is a method in which a hysteresis is provided for the threshold Vref used in binarizing processing of the output signal Va, instead of setting the threshold Vref at a constant value. By setting, for the threshold Vref, a hysteresis that is equal to or greater than a change width (amplitude at part indicated by arrow in FIG. 23) of the output signal Va of the magneto-resistive element 102a due to the magnetic rotary body 101b, it is possible to eliminate erroneous detection in the magneto-resistive element 102a due to the magnetic rotary body 101b. However, if a great hysteresis is set, when the output signal Va of the magneto-resistive element 102a due to the magnetic rotary body 101a is equal to or smaller than the hysteresis provided for the threshold Vref, the output signal Va cannot be detected. Thus, there is a problem that detectability of the magneto-resistive element 102a for the magnetic rotary body 101a is lowered. FIG. 23 shows an example in which a hysteresis at a level that does not influence the output signal Va of the magneto-resistive element 102a is set for the threshold Vref, but with this setting, erroneous detection due to the other magnetic rotary body 101b is not successfully eliminated.

<Magnetic Guides 6>

The details of the magnetic guides 6 which are major part of the present disclosure will be described. Providing the magnetic guides 6 enables adjustment of the directions and the intensities of the magnetic fields generated between the magnet 4 and the outer circumferential portions of the magnetic rotary bodies 1. With this adjustment, since the directions and the intensities of the magnetic fields applied to the magneto-resistive elements 2 are adjusted, sensitivity for the second magnetic rotary body 1b on the first magneto-resistive element 2a and sensitivity for the first magnetic rotary body 1a on the second magneto-resistive element 2b can be reduced.

Effects obtained by providing the magnetic guides 6 will be described with reference to FIG. 6. In FIG. 6, the horizontal axis indicates an axial-direction distance L between the axial-direction center position of the second magnetic rotary body 1b and a surface of the first magneto-resistive element 2a on the magnet 4 side shown in FIG. 2. The vertical axis indicates an amplitude Va-b representing change in the output signal Va of the first magneto-resistive element 2a due to the second magnetic rotary body 1b. The amplitude Va-b is a value normalized by defining the amplitude Va-b at L=0, as 1. At L=0, the amplitude Va-b of the output signal of the first magneto-resistive element 2a due to the second magnetic rotary body 1b is maximized. In FIG. 6, a solid line indicated by a (hereinafter, referred to as solid line a) represents the amplitude Va-b in the case of not providing the first magnetic guide 6a, and a broken line indicated by b (hereinafter, referred to as broken line b) represents the amplitude Va-b in the case of providing the first magnetic guide 6a. A dotted line indicated by c will be described later. In both of the solid line a and the broken line b, as the distance L increases, i.e., as the first magneto-resistive element 2a is more separated from the second magnetic rotary body 1b, the amplitude Va-b is reduced. In comparison between the solid line a and the broken line b, the reduction rate of the amplitude Va-b is greater in the broken line b. By providing the first magnetic guide 6a between the first magneto-resistive element 2a and the magnet 4, the influence of the second magnetic rotary body 1b on the first magneto-resistive element 2a is reduced. Therefore, the reduction rate of the amplitude Va-b is greater in the case of providing the first magnetic guide 6a.

In order to accurately detect different magnetic fields generated between the magnet 4, and the outer circumferential portion of the first magnetic rotary body 1a and the outer circumferential portion of the second magnetic rotary body 1b, it is necessary to sufficiently reduce the influence of the second magnetic rotary body 1b on the first magneto-resistive element 2a and the influence of the first magnetic rotary body 1a on the second magneto-resistive element 2b. For this purpose, it is necessary to increase the distance L until the amplitude Va-b is sufficiently reduced as shown in FIG. 6. By providing the first magnetic guide 6a, the influence of the second magnetic rotary body 1b on the first magneto-resistive element 2a can be reduced. Similarly, by providing the second magnetic guide 6b, the influence of the first magnetic rotary body 1a on the second magneto-resistive element 2b can be reduced.

With this structure, the axial-direction distance L between the axial-direction center position of the second magnetic rotary body 1b and the surface of the first magneto-resistive element 2a on the magnet 4 side can be reduced, whereby size increase in the magnetic detection device 100 can be suppressed. In addition, layout convenience of the magnetic rotary body 1 can be improved. Further, since the influence on the magneto-resistive element 2 by the magnetic rotary body 1 that is not a detection target can be reduced, it is possible to accurately detect each of changes in the magnetic fields due to the first magnetic rotary body 1a and the second magnetic rotary body 1b.

<Sizes of Magnetic Guides 6>

First, the sizes in the radial direction of the magnetic guides 6 will be described. As shown in FIG. 2, the radial-direction length of the first magnetic guide 6a is greater than the radial-direction length of the first magneto-resistive element 2a, and the radial-direction length of the second magnetic guide 6b is greater than the radial-direction length of the second magneto-resistive element 2b. The first magnetic guide 6a reduces the influence of the second magnetic rotary body 1b on the first magneto-resistive element 2a, and the second magnetic guide 6b reduces the influence of the first magnetic rotary body 1a on the second magneto-resistive element 2b. Thus, the magnetic guides 6 serve as shield plates for the magneto-resistive elements 2.

By providing the magnetic guides 6, the magnitudes of magnetic fields applied to the magneto-resistive elements 2 are changed. Therefore, detectability for the magnetic rotary bodies 1 is changed depending on the sizes, shapes, and arrangements of the magnetic guides 6. In the case where the radial-direction length of the magnetic guide 6 is smaller than the radial-direction length of the magneto-resistive element 2, since the direction and the magnitude of the magnetic field significantly vary at an end of the magnetic guide 6, the magnetic field applied to the magneto-resistive element 2 varies depending on variation in arrangement of the magnetic guide 6. It is difficult to suppress variation in arrangement of the magnetic guide 6 in manufacturing. If the radial-direction length of the magnetic guide 6 is set to be greater than the radial-direction length of the magneto-resistive element 2, it is possible to stabilize the magnetic field applied to the magneto-resistive element 2 without being influenced by variation in arrangement of the magnetic guide 6. In addition, robustness with respect to the position of the magnetic guide 6 is improved, whereby it is possible to stably manufacture the magnetic detection device 100 with high accuracy.

Next, the sizes in the circumferential direction of the magnetic guides 6 will be described. As shown in FIG. 3, the circumferential-direction lengths of the first magnetic guide 6a and the second magnetic guide 6b are greater than the circumferential-direction length of the magnet 4. FIG. 7 shows normalized values of the amplitude Va of a signal obtained from the first magneto-resistive element 2a in the case where a circumferential-direction length Lg of the first magnetic guide 6a is greater than a circumferential-direction length Lm of the magnet 4 (Lg>Lm) and in the case where the circumferential-direction length Lg of the first magnetic guide 6a is smaller than the circumferential-direction length Lm of the magnet 4 (Lg<Lm). In the case of Lg>Lm, the amplitude Va of the signal obtained from the first magneto-resistive element 2a is greater than in the case of Lg<Lm. Since the amplitude Va is great, it is possible to accurately detect change in the magnetic field due to the first magnetic rotary body 1a. Here, the output signal Va of the first magneto-resistive element 2a has been described, but also for the output signal of the second magneto-resistive element 2b, the same effects are obtained by setting Lg>Lm.

In the magnetic detection device 100 for detecting the magnetic rotary bodies 1 attached to, for example, a crankshaft, the detection unit 150 including the magnetic guides 6 is attached to an engine block (not shown). In this case, an O ring for sealing engine oil is mounted to the detection unit 150. Therefore, the outer shape of a part for storing the detection unit 150 is a cylindrical shape. An example of the outer shape of the part for storing the detection unit 150 is shown by a broken line in FIG. 3. As shown in FIG. 3, the magneto-resistive elements 2, the processing circuits 3, the magnetic guides 6, and the magnet 4 are arranged in the axial direction of the magnet 4. Therefore, the detection unit 150 is long in the axial direction of the magnet 4, and thus the diameter of the part for storing the detection unit 150 is approximately equal to the sum of the dimensions of the magneto-resistive elements 2, the processing circuits 3, the magnetic guides 6, and the magnet 4 in the axial direction of the magnet 4, and the intervals therebetween. Therefore, setting Lg to be greater than Lm does not influence the size of the detection unit 150 of the magnetic detection device 100. By setting Lg to be greater than Lm, it is possible to accurately detect each of changes in the magnetic fields due to the first magnetic rotary body 1a and the second magnetic rotary body 1b, while suppressing size increase in the magnetic detection device 100.

<Arrangement of Magneto-Resistive Elements 2 and Magnetic Guides 6>

Arrangement of the magneto-resistive elements 2 and the magnetic guides 6 will be described. As shown in FIG. 2 and FIG. 3, the first magnetic guide 6a and the second magnetic guide 6b formed in the same shape and the first magneto-resistive element 2a and the second magneto-resistive element 2b having the same shape are arranged symmetrically in the axial direction with respect to the magnet 4. As shown in FIG. 5, since the MR loop has line-symmetric characteristic, even when the direction of the applied magnetic field is reversed, the characteristic of the magneto-resistive element 2 is the same. In the case where the two magneto-resistive elements 2 having the same shape and the two magnetic guides 6 formed in the same shape are arranged with one magnet 4, the bias magnetic fields applied to the first magneto-resistive element 2a and the second magneto-resistive element 2b can be easily made equal by arranging the two magneto-resistive elements 2 and the two magnetic guides 6 symmetrically in the axial direction with respect to the magnet 4.

In addition, by symmetrically arranging the first magneto-resistive element 2a and the second magneto-resistive element 2b in a region in which the resistance change rate is great (for example, region ΔB in FIG. 5), it becomes possible to accurately detect a magnetic field in each of the first magneto-resistive element 2a and the second magneto-resistive element 2b. In addition, the first magnetic guide 6a and the second magnetic guide 6b are formed in the same shape and the first magnetic guide 6a and the second magnetic guide 6b are formed by identical parts. Therefore, the magnetic guides 6 can be manufactured at low cost. In addition, since the first magnetic guide 6a and the second magnetic guide 6b formed in the same shape and the first magneto-resistive element 2a and the second magneto-resistive element 2b having the same shape are symmetrically arranged in the axial direction with respect to the magnet 4, designing is needed for only the positional relationship on one side, and designing is not needed for the other side. Thus, the lead time for designing can be shortened. In addition, since the lead time for designing is shortened, the magnetic detection device 100 can be manufactured at low cost.

<Operation of Magnetic Detection Device 100>

Operation of the magnetic detection device 100 will be described. In FIG. 4, Va indicates an output signal of the first magneto-resistive element 2a. While the first magnetic rotary body 1a rotates about the rotation shaft 5, the magnetic field applied to the first magneto-resistive element 2a changes in accordance with arrangement of the protrusions 7a provided on the outer circumferential portion of the first magnetic rotary body 1a. In accordance with this change in the magnetic field, the output signal Va of the first magneto-resistive element 2a changes. FIG. 4 shows the case where signal change occurs in the output signal Va, due to the second magnetic rotary body 1b. In FIG. 4, Va-b represents signal change in the output signal Va of the first magneto-resistive element 2a due to the second magnetic rotary body 1b. As is found from comparison with the timing chart in the case of not providing the first magnetic guide 6a shown in FIG. 23, providing the first magnetic guide 6a makes the magnitude of Va-b smaller than in the case of not providing the first magnetic guide 6a.

By performing binarizing processing on the output signal Va using an appropriate threshold Vref, a rectangular wave signal Voa corresponding to the protrusions 7a provided to the outer circumferential portion of the first magnetic rotary body 1a is obtained. A hysteresis is provided for the threshold Vref used in binarizing processing of the output signal Va, instead of setting the threshold Vref at a constant value. By setting, for the threshold Vref, a hysteresis equal to or greater than the amplitude Va-b corresponding to change in the output signal Va of the first magneto-resistive element 2a due to the second magnetic rotary body 1b, the rectangular wave signal Voa in which erroneous detection due to the second magnetic rotary body 1b has been eliminated from output of the first magneto-resistive element 2a, is obtained. However, if a great hysteresis is set, it becomes impossible to detect the output signal Va when the output signal Va of the first magneto-resistive element 2a due to the first magnetic rotary body 1a is equal to or smaller than the threshold set for the threshold Vref. In the present embodiment, since the magnitude of Va-b is made small by providing the first magnetic guide 6a, it is possible to set, for the threshold Vref, a hysteresis at a level that does not influence the output signal Va of the first magneto-resistive element 2a.

In the above configuration, since the first magnetic guide 6a are provided, the magnitude of the amplitude Va-b corresponding to change in the output signal Va of the first magneto-resistive element 2a due to the second magnetic rotary body 1b is reduced. Thus, it is possible to set, for the threshold Vref, a hysteresis at a level that does not influence the output signal Va of the first magneto-resistive element 2a, whereby erroneous detection due to the second magnetic rotary body 1b can be eliminated from the rectangular wave signal Voa corresponding to the protrusions 7a provided to the outer circumferential portion of the first magnetic rotary body 1a. Since erroneous detection due to the second magnetic rotary body 1b can be eliminated from the rectangular wave signal Voa, change in the magnetic field due to the first magnetic rotary body 1a can be accurately detected. Here, the output signal Va of the first magneto-resistive element 2a has been described, but also for the output signal Vb of the second magneto-resistive element 2b and the rectangular wave signal Vob based thereon, the same effects are obtained by providing the second magnetic guide 6b.

As described above, in the magnetic detection device 100 according to the first embodiment, the first magnetic guide 6a formed from a magnetic body is provided between the magnet 4 and the first magneto-resistive element 2a, and the second magnetic guide 6b formed from a magnetic body is provided between the magnet 4 and the second magneto-resistive element 2b. Thus, it is possible to reduce the influence caused by change in the magnetic field due to the second magnetic rotary body 1b on the first magneto-resistive element 2a provided on the other side in the axial direction of the magnet 4, and the influence caused by change in the magnetic field due to the first magnetic rotary body 1a on the second magneto-resistive element 2b provided on one side in the axial direction of the magnet 4. In addition, since the influence caused by change in the magnetic field due to the second magnetic rotary body 1b on the first magneto-resistive element 2a and the influence caused by change in the magnetic field due to the first magnetic rotary body 1a on the second magneto-resistive element 2b are reduced, it is possible to accurately detect changes in the magnetic fields due to the first magnetic rotary body 1a and the second magnetic rotary body 1b. In addition, the axial-direction distance between the axial-direction center position of the second magnetic rotary body 1b and the surface of the first magneto-resistive element 2a on the magnet 4 side, and the axial-direction distance between the axial-direction center position of the first magnetic rotary body 1a and the surface of the second magneto-resistive element 2b on the magnet 4 side, can be reduced. Thus, size increase in the magnetic detection device 100 can be suppressed. Since the arrangement configuration of the first magnetic rotary body and the second magnetic rotary body are not changed, size increase in the magnetic detection device 100 can be suppressed. In addition, the magnitudes of signal change in the output signal Va of the first magneto-resistive element 2a due to the second magnetic rotary body 1b and signal change in the output signal Vb of the second magneto-resistive element 2b due to the first magnetic rotary body 1a, are reduced. Therefore, it is possible to set, for the threshold Vref, a hysteresis at a level that does not influence the output signal Va of the first magneto-resistive element 2a and the output signal Vb of the second magneto-resistive element 2b. In addition, erroneous detection due to the second magnetic rotary body 1b can be eliminated from the rectangular wave signal Voa, and erroneous detection due to the first magnetic rotary body 1a can be eliminated from the rectangular wave signal Vob. Thus, it is possible to accurately detect changes in the magnetic fields due to the first magnetic rotary body 1a and the second magnetic rotary body 1b.

The outer circumferential portion of the first magnetic rotary body 1a and the outer circumferential portion of the second magnetic rotary body 1b each have a plurality of protrusions 7 arranged at predetermined intervals in the circumferential direction. Therefore, through rotation of the first magnetic rotary body 1a and the second magnetic rotary body 1b, the outer circumferential portion of the first magnetic rotary body 1a and the outer circumferential portion of the second magnetic rotary body 1b can easily change magnetic fields between the magnet 4 and the respective outer circumferential portions. In addition, the plurality of protrusions 7a of the first magnetic rotary body 1a and the plurality of protrusions 7b of the second magnetic rotary body 1b are located at positions different from each other in the circumferential direction. Therefore, through rotation of the first magnetic rotary body 1a and the second magnetic rotary body 1b, the outer circumferential portion of the first magnetic rotary body 1a and the outer circumferential portion of the second magnetic rotary body 1b can cause differently changing magnetic fields between the magnet 4 and the respective outer circumferential portions.

The radial-direction length of the first magnetic guide 6a is greater than the radial-direction length of the first magneto-resistive element 2a, and the radial-direction length of the second magnetic guide 6b is greater than the radial-direction length of the second magneto-resistive element 2b, whereby magnetic fields applied to the magneto-resistive elements 2 can be stabilized without being influenced by variation in arrangement of the magnetic guides 6. In addition, robustness with respect to the positions of the magnetic guides 6 is improved, and it is possible to stably manufacture the magnetic detection device 100 with high accuracy. The circumferential-direction lengths of the first magnetic guide 6a and the second magnetic guide 6b are greater than the circumferential-direction length of the magnet 4. Thus, while size increase in the magnetic detection device 100 is suppressed, respective changes in the magnetic fields due to the first magnetic rotary body 1a and the second magnetic rotary body 1b can be accurately detected. The first magnetic guide 6a and the second magnetic guide 6b formed in the same shape and the first magneto-resistive element 2a and the second magneto-resistive element 2b having the same shape are symmetrically arranged in the axial direction with respect to the magnet 4, whereby bias magnetic fields applied to the first magneto-resistive element 2a and the second magneto-resistive element 2b can be easily made equal to each other. In addition, since the first magnetic guide 6a and the second magnetic guide 6b are formed by identical parts, the magnetic guides 6 can be manufactured at low cost. In addition, designing is needed for only the positional relationship on one side of the symmetric arrangement in the axial direction with respect to the magnet 4, and designing is not needed for the other side. Thus, the lead time for designing can be shortened. In addition, since the lead time for designing is shortened, the magnetic detection device 100 can be manufactured at low cost.

Second Embodiment

Figure 8:
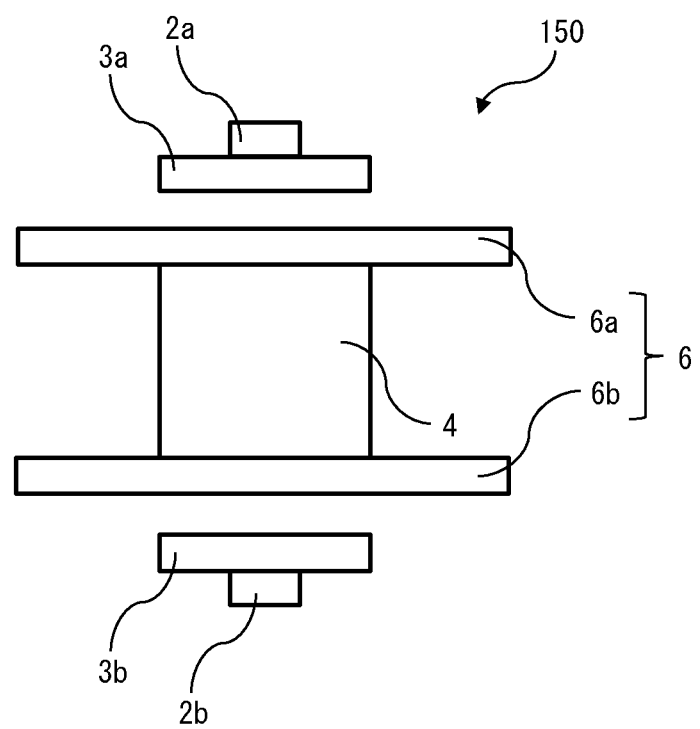
FIG. 8 is a side view of a detection unit of a magnetic detection device according to the second embodiment of the present disclosure.

A magnetic detection device 100 according to the second embodiment of the present disclosure will be described. FIG. 8 is a side view of the detection unit 150 of the magnetic detection device 100 according to the second embodiment as seen in the direction of arrow P in FIG. 1. The magnetic detection device 100 according to the second embodiment is configured such that the magnetic guides 6 are in contact with the magnet 4.

The first magnetic guide 6a and the second magnetic guide 6b are in contact with the magnet 4 as shown in FIG. 8. If the position of the magnetic guide 6 located between the magneto-resistive element 2 and the magnet 4 is changed, the magnetic field applied to the magneto-resistive element 2 is changed. For example, the predetermined region ΔB shown in FIG. 5 changes due to the change in the position of the magnetic guide 6. If the region ΔB is changed, the region that is close to a linear shape and has a great resistance change rate in the MR loop cannot be used. Thus, it becomes impossible to accurately detect each of changes in the magnetic fields due to the first magnetic rotary body 1a and the second magnetic rotary body 1b. When the magnetic guides 6 are provided in contact with the magnet 4, the positions of the magnetic guides 6 do not change in the axial direction of the magnet 4, and thus the position shift of the magnetic guides 6 can be suppressed. In addition, since the magnetic guides 6 formed from magnetic bodies are in contact with the magnet 4 while being attracted by the magnet 4, the positions of the magnetic guides 6 do not change also in the circumferential direction and the radial direction, and thus position shift of the magnetic guides 6 is suppressed.

As described above, in the magnetic detection device 100 according to the second embodiment, the first magnetic guide 6a and the second magnetic guide 6b are each in contact with the magnet 4, so that position shift of the magnetic guides 6 is suppressed. Thus, it is possible to accurately detect each of changes in the magnetic fields due to the first magnetic rotary body 1a and the second magnetic rotary body 1b. In addition, in the manufacturing process for the magnetic detection device 100, when the magnetic guides 6 are attached after the magnet 4 is magnetized, the magnetic guides 6 come into contact with the magnet 4 while being attracted by the magnet 4. Thus, positioning accuracy of the magnetic guides 6 can be improved. In addition, the magnetic guides 6 can be prevented from being damaged by dropping or the like, and thus productivity can be improved.

Third Embodiment

Figure 9:
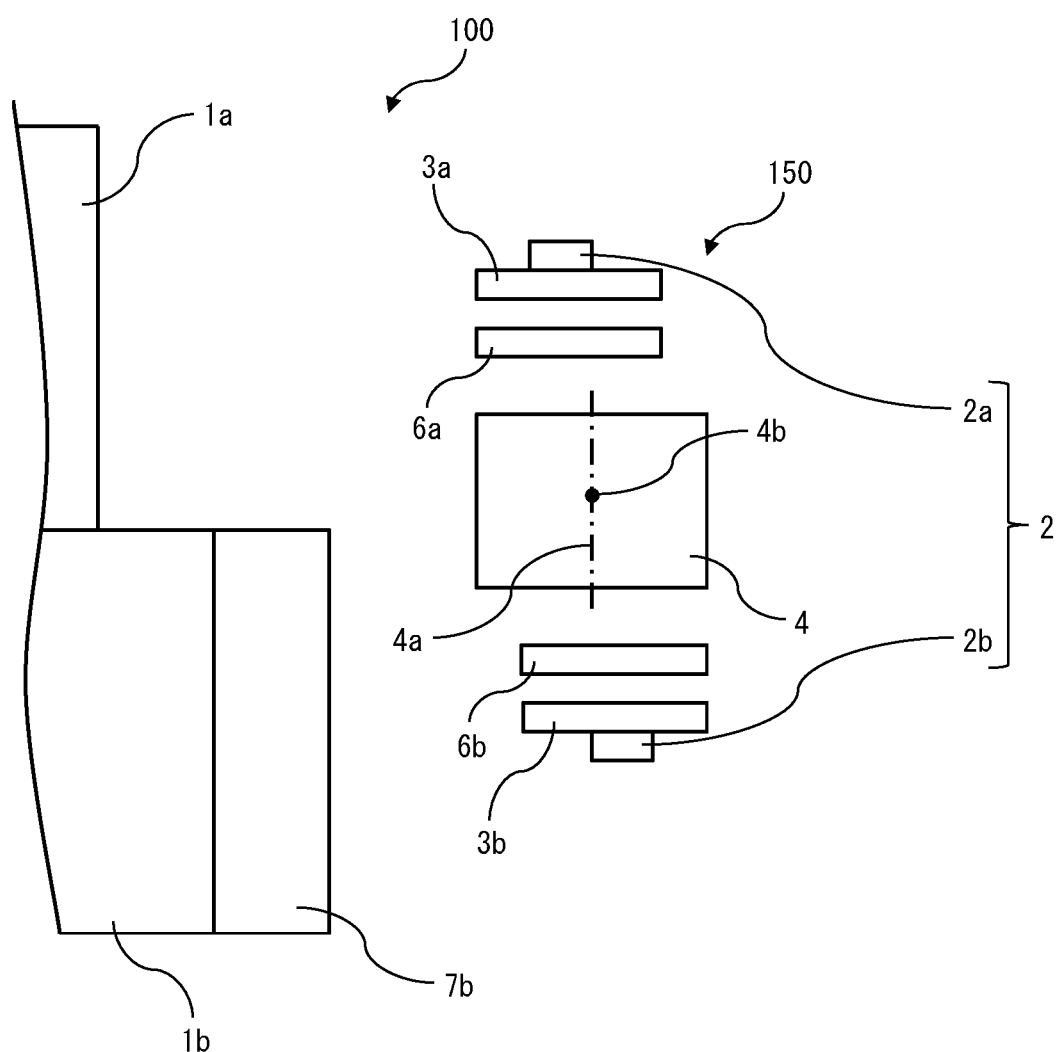
FIG. 9 is a side view of a detection unit of a magnetic detection device according to the third embodiment of the present disclosure.

A magnetic detection device 100 according to the third embodiment of the present disclosure will be described. FIG. 9 is a side view of the detection unit 150 of the magnetic detection device 100 according to the third embodiment. The magnetic detection device 100 according to the third embodiment is configured such that the diameters of the first magnetic rotary body 1a and the second magnetic rotary body 1b are different from each other.

The diameters of the first magnetic rotary body 1a and the second magnetic rotary body 1b of the magnetic detection device 100 are different from each other. As shown in FIG. 9, the diameter of the second magnetic rotary body 1b is greater than the diameter of the first magnetic rotary body 1a. In addition, the first magnetic guide 6a and the second magnetic guide 6b formed in the same shape and the first magneto-resistive element 2a and the second magneto-resistive element 2b having the same shape are arranged so as to be point-symmetric in a radial-direction plane with respect to an axial-direction center point 4b of the magnet 4. The reason why the magneto-resistive elements 2 are located so as to be point-symmetric in a radial-direction plane with respect to the center point 4b, is to apply similar bias magnetic fields to the first magneto-resistive element 2a and the second magneto-resistive element 2b, and to adjust the distances between the magneto-resistive elements 2, and the first magnetic rotary body 1a and the second magnetic rotary body 1b having different diameters.

As described above, in the magnetic detection device 100 according to the third embodiment, even though the diameters of the first magnetic rotary body 1a and the second magnetic rotary body 1b are different from each other, the first magnetic guide 6a and the second magnetic guide 6b formed in the same shape and the first magneto-resistive element 2a and the second magneto-resistive element 2b having the same shape are arranged so as to be point-symmetric in a radial-direction plane with respect to the axial-direction center point 4b of the magnet 4, and therefore it is possible to accurately detect each of changes in the magnetic fields due to the first magnetic rotary body 1a and the second magnetic rotary body 1b. In addition, the degree of freedom in the shapes of the magnetic rotary bodies 1 can be improved.

Fourth Embodiment

Figure 10:
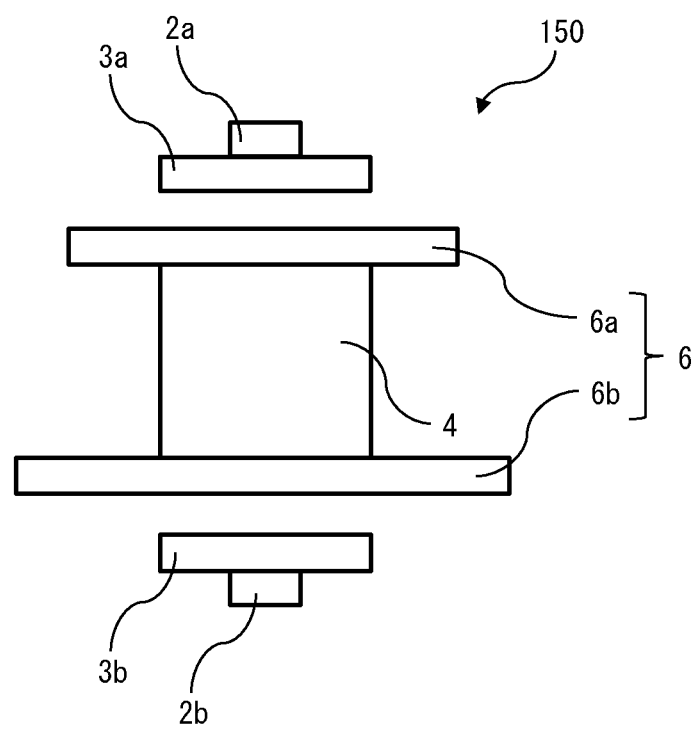
FIG. 10 is a side view of a detection unit of a magnetic detection device according to the fourth embodiment of the present disclosure.

A magnetic detection device 100 according to the fourth embodiment of the present disclosure will be described. FIG. 10 is a side view of the detection unit 150 of the magnetic detection device 100 according to the fourth embodiment as seen in the direction of arrow P in FIG. 1.

The magnetic detection device 100 according to the fourth embodiment is configured such that the circumferential-direction lengths of the first magnetic guide 6a and the second magnetic guide 6b are different from each other.

As described above, through adjustment of the positional relationship among the magneto-resistive elements 2, the magnetic guides 6, and the magnet 4, a region that is close to a linear shape and has a great resistance change rate in the MR loop can be used. In the case where the protrusions 7 have different circumferential-direction widths, the manners of changes in the magnetic fields applied to the magneto-resistive elements 2 are different. In the case where the protrusions 7 have different circumferential-direction widths, it is sometimes impossible to easily obtain desired output signals of the magneto-resistive elements 2 merely by adjusting the positional relationship among the magneto-resistive elements 2, the magnetic guides 6, and the magnet 4. By changing the circumferential-direction lengths of the magnetic guides 6, it becomes possible to easily obtain desired output signals of the magneto-resistive elements 2 even when the protrusions 7 have different circumferential-direction widths.

The configuration in which the circumferential-direction lengths of the magnetic guide 6 are changed will be described. As shown in FIG. 10, the circumferential-direction lengths of the first magnetic guide 6a and the second magnetic guide 6b of the magnetic detection device 100 are different. The circumferential-direction length of the second magnetic guide 6b is greater than the circumferential-direction length of the first magnetic guide 6a. In the case where the protrusion 7a of the first magnetic rotary body 1a has a great circumferential-direction width, change in the waveform Va-w of the output signal of the first magneto-resistive element 2a shown in FIG. 4 becomes mild. That is, the wavelength of the waveform Va-w is elongated. In addition, in the case where the interval between the protrusion 7a and the protrusion 7a adjacent to each other on the first magnetic rotary body 1a is narrow, a separated waveform corresponding to each protrusion 7a is not obtained from the output signal Va of the first magneto-resistive element 2a. In such cases, change in the magnetic field due to the first magnetic rotary body 1a cannot be accurately detected, and thus detection for change in the magnetic field might become impossible in itself.

In such cases, change in the output signal Va can be sharpened by reducing the width of the first magnetic guide 6a in the circumferential direction of the first magnetic rotary body 1a. That is, the wavelength of the waveform Va-w is shortened, so that separated desired waveforms of the output signal Va of the first magneto-resistive element 2a can be obtained correspondingly for the respective protrusions 7a of the first magnetic rotary body 1a. Since separated desired waveforms of the output signal Va of the first magneto-resistive element 2a are obtained, change in the magnetic field due to the first magnetic rotary body 1a can be accurately detected. Here, the output signal Va of the first magneto-resistive element 2a has been described, but also for the output signal Vb of the second magneto-resistive element 2b, the same effects are obtained by changing the circumferential-direction length of the second magnetic guide 6b.

As described above, in the magnetic detection device 100 according to the fourth embodiment, the circumferential-direction lengths of the first magnetic guide 6a and the second magnetic guide 6b of the magnetic detection device 100 are different from each other. Therefore, even in the case where the widths or intervals of the protrusions 7 of the respective magnetic rotary bodies 1 are different, it is possible to accurately detect each of changes in the magnetic fields due to the first magnetic rotary body 1a and the second magnetic rotary body 1b. In addition, requirements for shapes such as widths or intervals of the protrusions 7 of the magnetic rotary bodies 1 can be loosened, whereby the lead time in designing is shortened and the weight of the magnetic rotary body 1 can be reduced. In addition, the magnetic detection device 100 can be manufactured at low cost.

Fifth Embodiment

Figure 11:
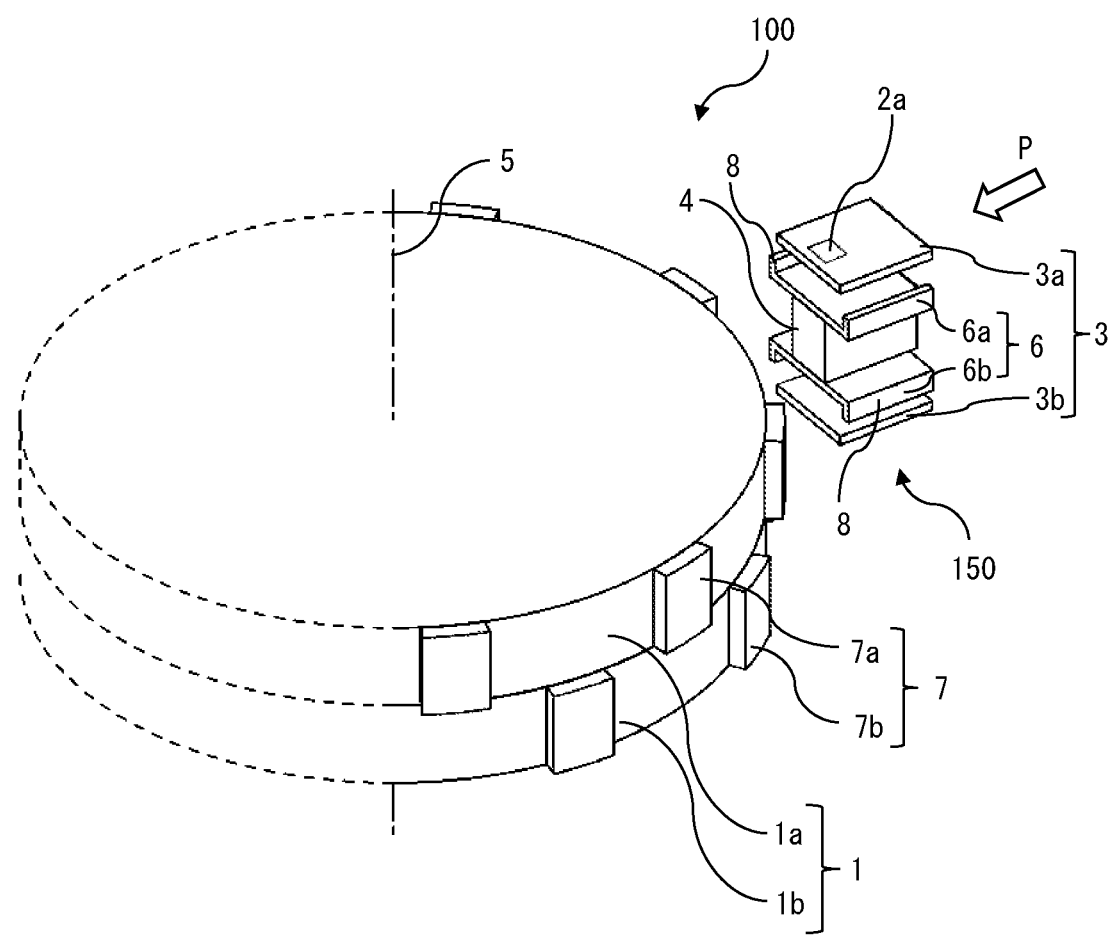
FIG. 11 is a perspective view schematically showing the structure of a magnetic detection device according to the fifth embodiment of the present disclosure.
Figure 12:
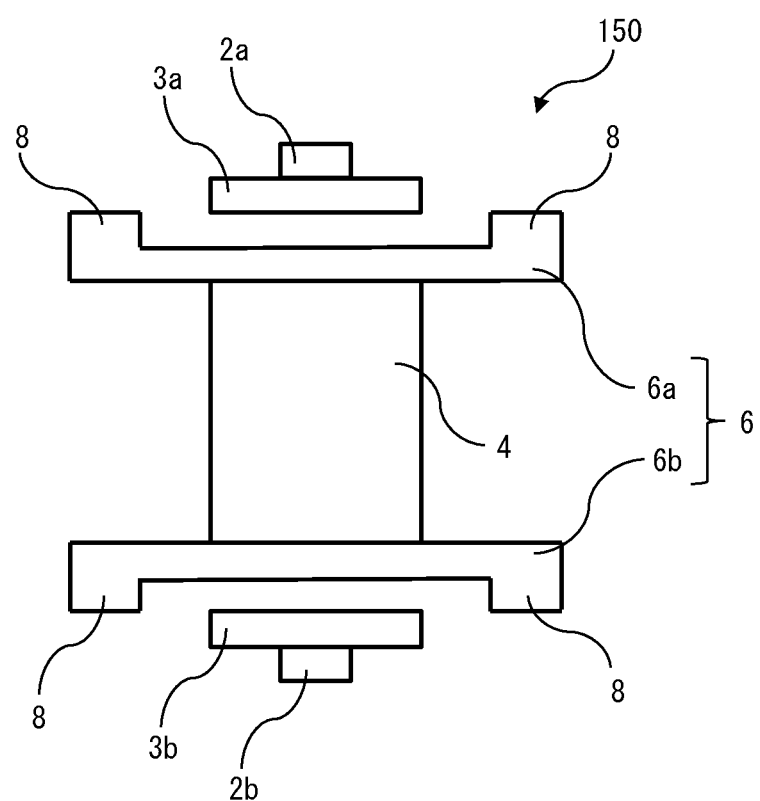
FIG. 12 is a side view of a detection unit of the magnetic detection device according to the fifth embodiment.
Figure 13:
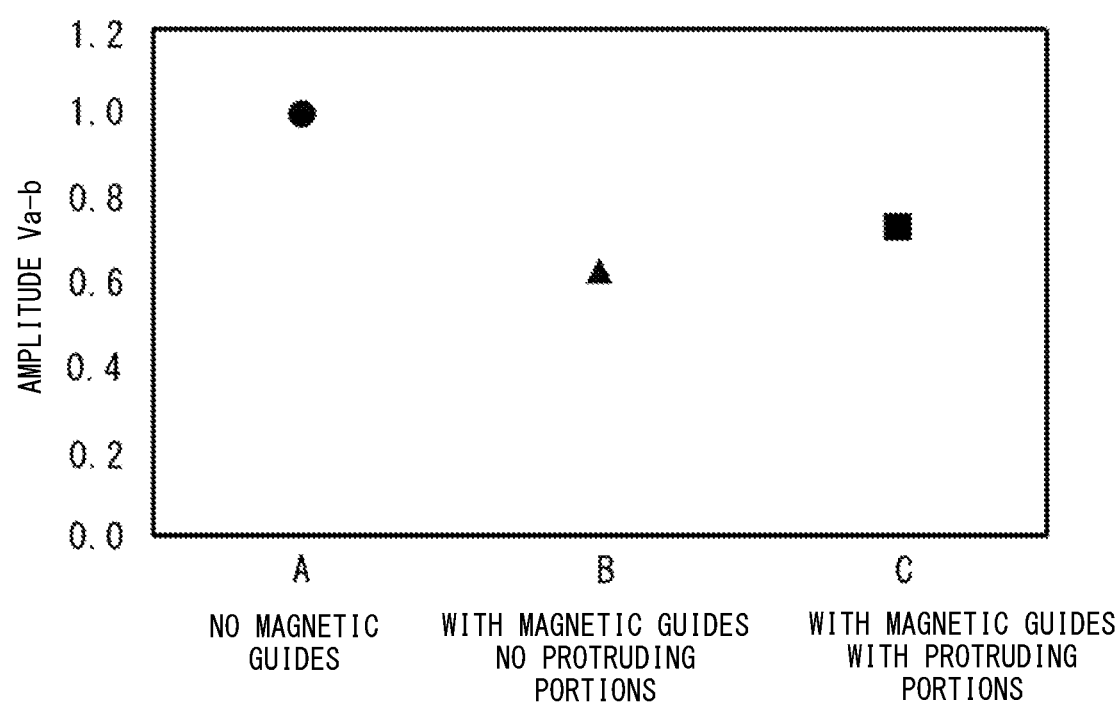
FIG. 13 shows effects obtained by providing protruding portions to magnetic guides of the magnetic detection device according to the fifth embodiment.

A magnetic detection device 100 according to the fifth embodiment of the present disclosure will be described. FIG. 11 is a perspective view schematically showing the structure of the magnetic detection device 100 according to the fifth embodiment, FIG. 12 is a side view of the detection unit 150 of the magnetic detection device 100 as seen in the direction of arrow P in FIG. 11, and FIG. 13 shows effects obtained by providing protruding portions 8 to the magnetic guides 6 of the magnetic detection device 100. The magnetic detection device 100 according to the fifth embodiment is configured such that each magnetic guide 6 has the protruding portions 8 on both sides in the circumferential direction.

As described above, since the magnetic guides 6 are provided, the influence on the first magneto-resistive element 2a caused by change in the magnetic field due to the second magnetic rotary body 1b not opposed to the first magneto-resistive element 2a, and the influence on the second magneto-resistive element 2b caused by change in the magnetic field due to the first magnetic rotary body 1a not opposed to the second magneto-resistive element 2b, are reduced. Meanwhile, providing the magnetic guides 6 also reduces the magnetic fields due to the respective magnetic rotary bodies 1 that are detection targets opposed to the magneto-resistive elements 2. The reduction in the magnetic fields for the detection targets leads to deterioration in detection accuracy. In the present embodiment, the magnetic guides 6 have the protruding portions 8 on both sides in the circumferential direction, thereby suppressing reduction in the magnetic fields that are detection targets.

As shown in FIG. 11 and FIG. 12, the first magnetic guide 6a has two protruding portions 8 protruding from both sides in the circumferential direction toward the other side in the axial direction, and the second magnetic guide 6b has two protruding portions 8 protruding from both sides in the circumferential direction toward one side in the axial direction. Here, the protruding portions 8 are provided on both sides in the circumferential direction of the first magnetic guide 6a and the second magnetic guide 6b, but the positions of the protruding portions 8 are not limited thereto. The protruding portions 8 only have to be present on both sides in the circumferential direction of each magneto-resistive element 2. Therefore, the protruding portions 8 may be provided inward of both ends in the circumferential direction of each of the first magnetic guide 6a and the second magnetic guide 6b. The heights of the protruding portions 8 are, for example, about 1 mm. However, the heights of the protruding portions 8 are not limited thereto.

Effects obtained by providing the protruding portions 8 will be described with reference to FIG. 13. FIG. 13 shows the amplitude Va-b in the case of L=0 in FIG. 6, for each of structures indicated by the horizontal axis. A, B, and C in the horizontal axis are as follows: A indicates the case of not providing the first magnetic guide 6a, B indicates the case of providing the first magnetic guide 6a not having the protruding portions 8, and C indicates the case of providing the first magnetic guide 6a having the protruding portions 8. The vertical axis indicates the amplitude Va-b representing change in the output signal Va of the first magneto-resistive element 2a due to the second magnetic rotary body 1b opposed to the first magneto-resistive element 2a, under normalization with the amplitude Va-b at A defined as 1. From comparison between A and B, it is found that providing the first magnetic guide 6a reduces the magnetic field due to the second magnetic rotary body 1b opposed to the first magneto-resistive element 2a. From comparison between B and C, it is found that providing the protruding portions 8 to the first magnetic guide 6a increases the magnetic field due to the second magnetic rotary body 1b opposed to the first magneto-resistive element 2a. The increase in the magnetic field is caused because the direction of the magnetic field applied to the first magneto-resistive element 2a is directed toward the first magneto-resistive element 2a by providing the protruding portions 8 so that the magnetic field is efficiently applied to the first magneto-resistive element 2a.

Further effects obtained by providing the protruding portions 8 will be described with reference to FIG. 6. In FIG. 6, a dotted line indicated by c (hereinafter, referred to as dotted line c) represents the amplitude Va-b in the case of providing the first magnetic guide 6a having the protruding portions 8. Also in the dotted line c, as the distance L increases, i.e., as the first magneto-resistive element 2a is more separated from the second magnetic rotary body 1b, the change Va-b is reduced. In comparison among the solid line a, the broken line b, and the dotted line c, the reduction rate of the amplitude Va-b is greatest in the dotted line c. When the first magnetic guide 6a having the protruding portions 8 is provided between the first magneto-resistive element 2a and the magnet 4, the influence of the second magnetic rotary body 1b on the first magneto-resistive element 2a is further reduced. Therefore, the reduction rate of the amplitude Va-b is greater in the case of providing the first magnetic guide 6a having the protruding portions 8. Since the first magnetic guide 6a having the protruding portions 8 is provided, the influence of the second magnetic rotary body 1b on the first magneto-resistive element 2a can be further reduced. Similarly, by providing the second magnetic guide 6b having the protruding portions 8, the influence of the first magnetic rotary body 1a on the second magneto-resistive element 2b can be reduced.

As described above, in the magnetic detection device 100 according to the fifth embodiment, the first magnetic guide 6a has two protruding portions 8 protruding from both sides in the circumferential direction toward the other side in the axial direction, and the second magnetic guide 6b has two protruding portions 8 protruding from both sides in the circumferential direction toward one side in the axial direction. Thus, the magnetic field due to the magnetic rotary body 1 that is opposed in the radial direction to the magneto-resistive element 2 and is a detection target, can be increased. In addition, the magnetic field due to the magnetic rotary body 1 that is not opposed in the radial direction to the magneto-resistive element 2 and is not a detection target, can be reduced. That is, the magnetic field due to the magnetic rotary body 1 that is a detection target is increased, and the magnetic field due to the magnetic rotary body 1 that is not a detection target is reduced. Thus, it is possible to accurately detect each of changes in magnetic fields due to the first magnetic rotary body 1a and the second magnetic rotary body 1b.

Sixth Embodiment

Figure 14:
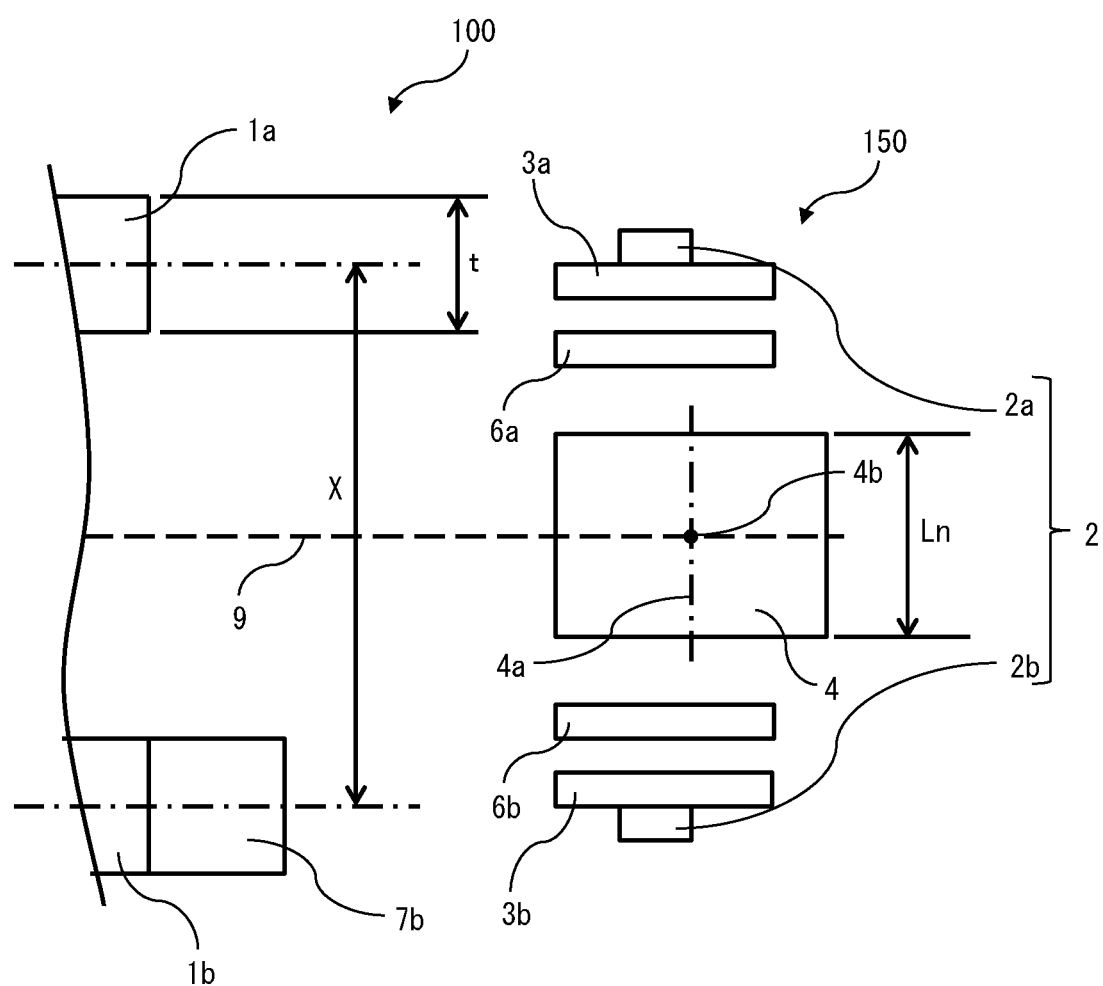
FIG. 14 is a side view of a detection unit of a magnetic detection device according to the sixth embodiment of the present disclosure.
Figure 15:
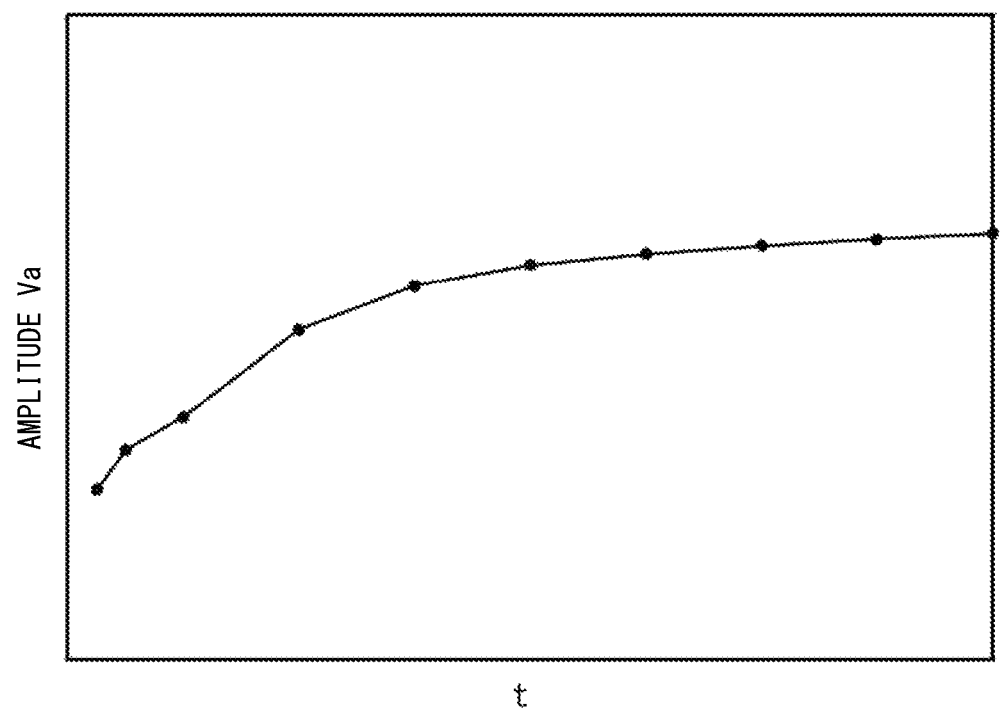
FIG. 15 is a graph showing the relationship between the thickness of a magnetic rotary body and an output signal of a magneto-resistive element in the magnetic detection device according to the sixth embodiment.

A magnetic detection device 100 according to the sixth embodiment of the present disclosure will be described. FIG. 14 is a side view of the detection unit 150 of the magnetic detection device 100 according to the sixth embodiment, and FIG. 15 is a graph showing the relationship between an axial-direction thickness t of the first magnetic rotary body 1a and the amplitude Va of the output signal of the first magneto-resistive element 2a in the magnetic detection device 100. The magnetic detection device 100 according to the sixth embodiment is configured such that the magnetic rotary bodies 1 are arranged so as to be spaced from each other in the axial direction.

As a structure for reducing the influence on the first magneto-resistive element 2a caused by change in the magnetic field due to the second magnetic rotary body 1b not opposed to the first magneto-resistive element 2a, and the influence on the second magneto-resistive element 2b caused by change in the magnetic field due to the first magnetic rotary body 1a not opposed to the second magneto-resistive element 2b, it is conceivable that the first magnetic rotary body 1a and the second magnetic rotary body 1b are arranged so as to be spaced from each other in the axial direction. However, in the case where the first magnetic rotary body 1a and the second magnetic rotary body 1b are arranged so as to be spaced from each other in the axial direction while their shapes are not changed, the magnetic field due to the magnetic rotary body 1 that is not a detection target can be decreased, but the size of the magnetic detection device 100 is increased. The present embodiment describes a configuration in which the first magnetic rotary body 1a and the second magnetic rotary body 1b are arranged so as to be spaced from each other in the axial direction while size increase in the magnetic detection device 100 is suppressed.

The first magnetic rotary body 1a and the second magnetic rotary body 1b are arranged so as to be spaced from each other in the axial direction as shown in FIG. 14. In addition, the axial-direction thicknesses of the first magnetic rotary body 1a and the second magnetic rotary body 1b are smaller than the axial-direction thicknesses of the first magnetic rotary body 1a and the second magnetic rotary body 1b shown in the above embodiments. Since the axial-direction thicknesses of the first magnetic rotary body 1a and the second magnetic rotary body 1b are reduced, size increase in the magnetic detection device 100 can be suppressed.

The principle on which the axial-direction thicknesses of the first magnetic rotary body 1a and the second magnetic rotary body 1b can be reduced will be described with reference to FIG. 15. In FIG. 15, the horizontal axis indicates the axial-direction thickness t of the first magnetic rotary body 1a. The vertical axis indicates the amplitude Va of the output signal of the first magneto-resistive element 2a. Even if the axial-direction thickness t of the first magnetic rotary body 1a is increased, the amplitude Va for the first magneto-resistive element 2a is saturated when the thickness t becomes a certain value or greater. Therefore, by setting the thickness t to such a degree that does not greatly reduce the amplitude Va, the first magnetic rotary body 1a and the second magnetic rotary body 1b can be arranged so as to be spaced from each other in the axial direction while accurate detection of change in the magnetic field due to the first magnetic rotary body 1a is ensured. Since the thickness t can be reduced to such a degree that does not greatly reduce the amplitude Va, size increase in the magnetic detection device 100 can be suppressed. Here, the amplitude Va for the first magneto-resistive element 2a has been described, but also for the output signal of the second magneto-resistive element 2b, the characteristic thereof is the same, and therefore the thickness t of the second magnetic rotary body 1b can be reduced in the same manner.

With the above configuration, the first magnetic rotary body 1a and the second magnetic rotary body 1b can be arranged so as to be spaced from each other in the axial direction. Therefore, it is possible to reduce the influence on the first magneto-resistive element 2a caused by change in the magnetic field due to the second magnetic rotary body 1b not opposed to the first magneto-resistive element 2a, and the influence on the second magneto-resistive element 2b caused by change in the magnetic field due to the first magnetic rotary body 1a not opposed to the second magneto-resistive element 2b. In addition, since the thicknesses of the first magnetic rotary body 1a and the second magnetic rotary body 1b can be reduced, size increase in the magnetic detection device 100 can be suppressed and the weight of the magnetic detection device 100 can be reduced.

<Shapes of Magnetic Rotary Bodies 1>

Figure 16:
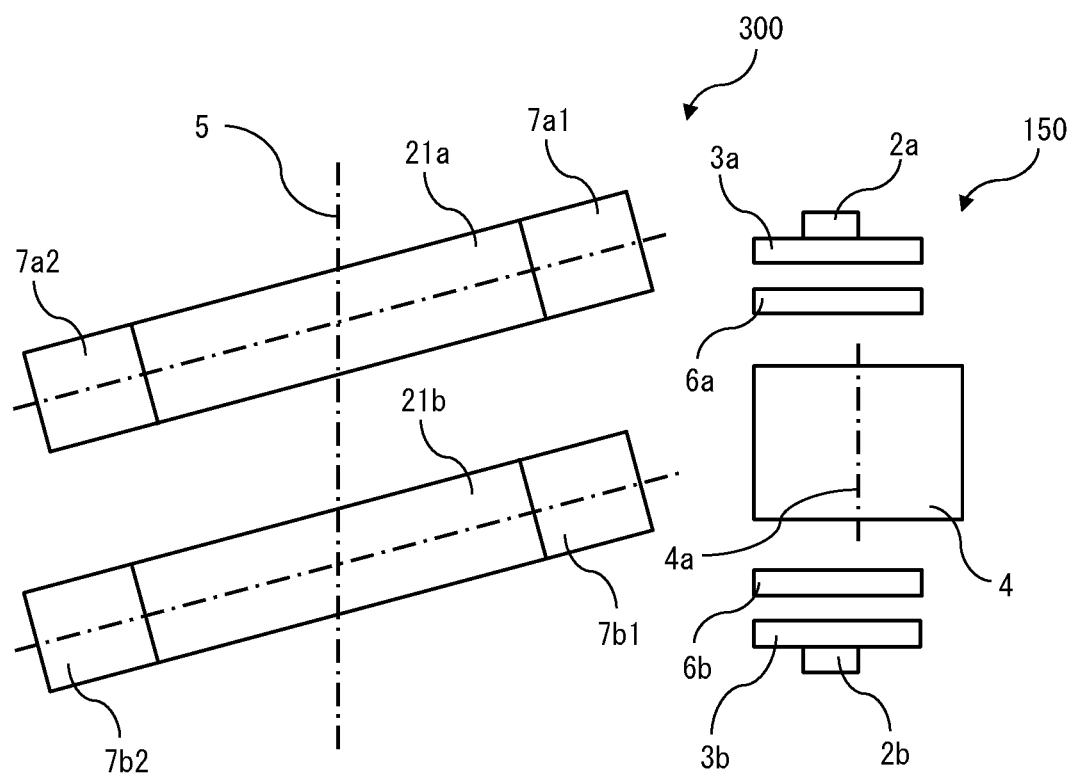
FIG. 16 is a side view of another magnetic detection device according to the sixth embodiment.

As shown in FIG. 14, the first magnetic rotary body 1a and the second magnetic rotary body 1b are formed in cylindrical shapes about the rotation shaft 5. FIG. 16 is a side view of another magnetic detection device 300 according to the sixth embodiment. In the magnetic detection device 300 shown in FIG. 16, the first magnetic rotary body 21a and the second magnetic rotary body 21b are formed in cylindrical shapes, but the first magnetic rotary body 21a and the second magnetic rotary body 21b are not formed in cylindrical shapes about the rotation shaft 5.

In the case where the first magnetic rotary body 21a and the second magnetic rotary body 21b are formed as shown in FIG. 16, the distance from the first magneto-resistive element 2a to a protrusion 7a1 is different from the distance from the first magneto-resistive element 2a to a protrusion 7a2 when the first magnetic rotary body 21a is rotated by 180 degrees in synchronization with the rotation shaft 5. In the case where the distances between the first magneto-resistive element 2a and the respective protrusions 7a provided on the outer circumferential portion of the first magnetic rotary body 21a are different, the amplitude Va of the output signal of the first magneto-resistive element 2a based on the magnetic field for each protrusion 7a is different. If the amplitude Va differs and thus the amplitude Va varies, change in the magnetic field due to the first magnetic rotary body 1a cannot be accurately detected.

In addition, when the second magnetic rotary body 21b is rotated, the distance between the first magneto-resistive element 2a and each protrusion 7b provided on the outer circumferential portion of the second magnetic rotary body 21b also differs. In FIG. 16, a protrusion 7b1 of the second magnetic rotary body 21b which is not a detection target is closer to the first magneto-resistive element 2a, as compared to FIG. 14. Since the protrusion 7b1 is closer to the first magneto-resistive element 2a, it is difficult to reduce the influence on the first magneto-resistive element 2a caused by change in the magnetic field due to the second magnetic rotary body 21b. Here, only the influence on the first magneto-resistive element 2a has been shown, but also the influence on the second magneto-resistive element 2b is the same.

In the present structure, when the magnetic rotary body 1 is rotated, the distances between the magneto-resistive element 2 and the protrusions 7 opposed thereto in the radial direction are equal. Thus, it is possible to accurately detect each of changes in the magnetic fields due to the first magnetic rotary body 1a and the second magnetic rotary body 1b. In addition, when the magnetic rotary body 1 is rotated, the distances between the magneto-resistive element 2 and the protrusions 7 which are not opposed thereto in the radial direction and are not detection targets, are also equal. Thus, the influence on the first magneto-resistive element 2a caused by change in the magnetic field due to the second magnetic rotary body 1b not opposed to the first magneto-resistive element 2a, and the influence on the second magneto-resistive element 2b caused by change in the magnetic field due to the first magnetic rotary body 1a not opposed to the second magneto-resistive element 2b, are reduced, whereby it is possible to accurately detect changes in the magnetic fields due to the first magnetic rotary body 1a and the second magnetic rotary body 1b.

<Arrangement of Magnetic Rotary Bodies 1>

As shown in FIG. 14, the axial-direction center position between the first magnetic rotary body 1a and the second magnetic rotary body 1b, and the center point 4b which is the axial-direction center position of the magnet 4, coincide with each other in the axial direction. That is, assuming a plane 9 perpendicular to the axial direction and including the axial-direction center position between the first magnetic rotary body 1a and the second magnetic rotary body 1b, and the center point 4b which is the axial-direction center position of the magnet 4, the axial-direction distances from the plane 9 to the first magnetic rotary body 1a and the second magnetic rotary body 1b are equal. Since the first magnetic rotary body 1a and the second magnetic rotary body 1b are arranged as described above, changes in the magnetic fields caused when the first magnetic rotary body 1a and the second magnetic rotary body 1b are rotated can be easily equally applied to the first magneto-resistive element 2a and the second magneto-resistive element 2b. In the case where the first magneto-resistive element 2a and the second magneto-resistive element 2b having the same shape are arranged symmetrically in the axial direction with respect to the magnet 4, changes in the magnetic fields caused when the first magnetic rotary body 1a and the second magnetic rotary body 1b are rotated can be equally applied to the first magneto-resistive element 2a and the second magneto-resistive element 2b, further easily.

With the above structure, changes in the magnetic fields caused when the first magnetic rotary body 1a and the second magnetic rotary body 1b are rotated can be easily equally applied to the first magneto-resistive element 2a and the second magneto-resistive element 2b. In addition, the first magneto-resistive element 2a and the second magneto-resistive element 2b can be easily arranged in a region where the resistance change rates of the first magneto-resistive element 2a and the second magneto-resistive element 2b are great. In addition, since the first magneto-resistive element 2a and the second magneto-resistive element 2b can be easily arranged in a region where the resistance change rates of the first magneto-resistive element 2a and the second magneto-resistive element 2b are great, it is possible to accurately detect changes in the magnetic fields due to the first magnetic rotary body 1a and the second magnetic rotary body 1b.

As described above, in the magnetic detection device 100 according to the sixth embodiment, since the first magnetic rotary body 1a and the second magnetic rotary body 1b are arranged so as to be spaced from each other in the axial direction, the influence on the first magneto-resistive element 2a caused by change in the magnetic field due to the second magnetic rotary body 1b not opposed to the first magneto-resistive element 2a, and the influence on the second magneto-resistive element 2b caused by change in the magnetic field due to the first magnetic rotary body 1a not opposed to the second magneto-resistive element 2*b*, can be reduced. In addition, since the thicknesses of the first magnetic rotary body 1*a* and the second magnetic rotary body 1*b* can be reduced, size increase in the magnetic detection device 100 can be suppressed and the weight of the magnetic detection device 100 can be reduced.

In the case where the first magnetic rotary body 1*a* and the second magnetic rotary body 1*b* are formed in cylindrical shapes about the rotation shaft 5, the distances between the magneto-resistive element 2 and the protrusions 7 opposed thereto in the radial direction when the magnetic rotary body 1 is rotated are equal. Thus, it is possible to accurately detect each of changes in the magnetic fields due to the first magnetic rotary body 1*a* and the second magnetic rotary body 1*b*. In addition, when the magnetic rotary body 1 is rotated, the distances between the magneto-resistive element 2 and the protrusions 7 that are not opposed thereto in the radial direction and are not detection targets are also equal. Thus, the influence on the first magneto-resistive element 2*a* caused by change in the magnetic field due to the second magnetic rotary body 1*b* not opposed to the first magneto-resistive element 2*a* and the influence on the second magneto-resistive element 2*b* caused by change in the magnetic field due to the first magnetic rotary body 1*a* not opposed to the second magneto-resistive element 2*b*, are reduced, so that it is possible to accurately detect changes in the magnetic fields due to the first magnetic rotary body 1*a* and the second magnetic rotary body 1*b*.

In the case where the axial-direction center position between the first magnetic rotary body 1*a* and the second magnetic rotary body 1*b*, and the axial-direction center position of the magnet 4, coincide with each other in the axial direction, changes in the magnetic fields caused when the first magnetic rotary body 1*a* and the second magnetic rotary body 1*b* are rotated can be easily equally applied to the first magneto-resistive element 2*a* and the second magneto-resistive element 2*b*. In addition, the first magneto-resistive element 2*a* and the second magneto-resistive element 2*b* can be easily arranged in a region where the resistance change rates of the first magneto-resistive element 2*a* and the second magneto-resistive element 2*b* are great.

Seventh Embodiment

Figure 17:
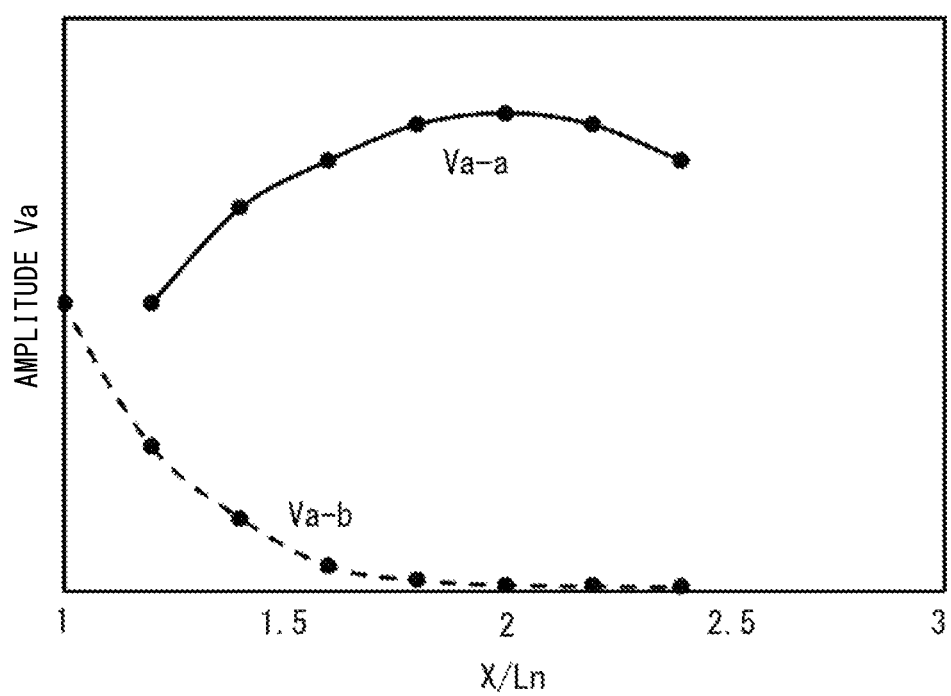
FIG. 17 is a graph showing the relationship between an output signal of a magneto-resistive element and the distance between the magnetic rotary bodies in a magnetic detection device according to the seventh embodiment of the present disclosure.

A magnetic detection device 100 according to the seventh embodiment of the present disclosure will be described. FIG. 17 is a graph showing the relationship between the output signal of the first magneto-resistive element 2*a* and the distance between the magnetic rotary bodies 1 of the magnetic detection device 100 according to the seventh embodiment. The magnetic detection device 100 according to the seventh embodiment is configured to prescribe the interval between the magnetic rotary bodies 1 of the magnetic detection device 100 according to the sixth embodiment.

An axial-direction interval X between the first magnetic rotary body 1*a* and the second magnetic rotary body 1*b* is prescribed to be equal to or greater than 1.8 times an axial-direction length Ln of the magnet 4. Effects of such prescription will be described with reference to FIG. 17. In FIG. 17, the horizontal axis indicates X/Ln which is the ratio of the interval X between the first magnetic rotary body 1*a* and the second magnetic rotary body 1*b* with respect to the axial-direction length Ln of the magnet 4 shown in FIG. 14, in the case where the length Ln is constant. The vertical axis indicates an amplitude Va-a of the output signal Va of the first magneto-resistive element 2*a* based on the magnetic field due to the first magnetic rotary body 1*a*, and the amplitude Va-b of the output signal Va of the first magneto-resistive element 2*a* based on the magnetic field due to the second magnetic rotary body 1*b* which is not a detection target. When X/Ln=2, the first magnetic rotary body 1*a* and the first magneto-resistive element 2*a* are opposed to each other in the radial direction and the second magnetic rotary body 1*b* and the second magneto-resistive element 2*b* are opposed to each other in the radial direction. FIG. 14 shows the case of X/Ln=2.

The amplitude Va-a once increases so as to have a peak and then decreases, in accordance with the interval between the first magnetic rotary body 1*a* and the second magnetic rotary body 1*b*. The peak corresponds to the case of X/Ln=2. The amplitude Va-b decreases as the interval between the first magnetic rotary body 1*a* and the second magnetic rotary body 1*b* increases. That is, the amplitude Va-b decreases as the distance between the first magneto-resistive element 2*a* and the second magnetic rotary body 1*b* increases. If the amplitude Va-a corresponding to the detection target is great and the amplitude Va-b not corresponding to the detection target is small, it is possible to accurately detect change in the magnetic field due to the first magnetic rotary body 1*a*. From FIG. 17, X/Ln that enables change in the magnetic field to be accurately detected can be estimated to be 1.8 or greater. Here, only the output signal of the first magneto-resistive element 2*a* has been shown, but the same applies also to the output signal of the second magneto-resistive element 2*b*.

As described above, in the magnetic detection device 100 according to the seventh embodiment, the axial-direction interval X between the first magnetic rotary body 1*a* and the second magnetic rotary body 1*b* is equal to or greater than 1.8 times the axial-direction length Ln of the magnet 4. Thus, the influence on the first magneto-resistive element 2*a* caused by change in the magnetic field due to the second magnetic rotary body 1*b* not opposed to the first magneto-resistive element 2*a*, and the influence on the second magneto-resistive element 2*b* caused by change in the magnetic field due to the first magnetic rotary body 1*a* not opposed to the second magneto-resistive element 2*b*, are reduced, whereby it is possible to accurately detect changes in the magnetic fields due to the first magnetic rotary body 1*a* and the second magnetic rotary body 1*b*. In addition, output of the first magneto-resistive element 2*a* based on change in the magnetic field due to the first magnetic rotary body 1*a* opposed to the first magneto-resistive element 2*a*, and output of the second magneto-resistive element 2*b* based on change in the magnetic field due to the second magnetic rotary body 1*b* opposed to the second magneto-resistive element 2*b*, are ensured, so that it is possible to accurately detect changes in the magnetic fields due to the first magnetic rotary body 1*a* and the second magnetic rotary body 1*b*.

Eighth Embodiment

Figure 18:
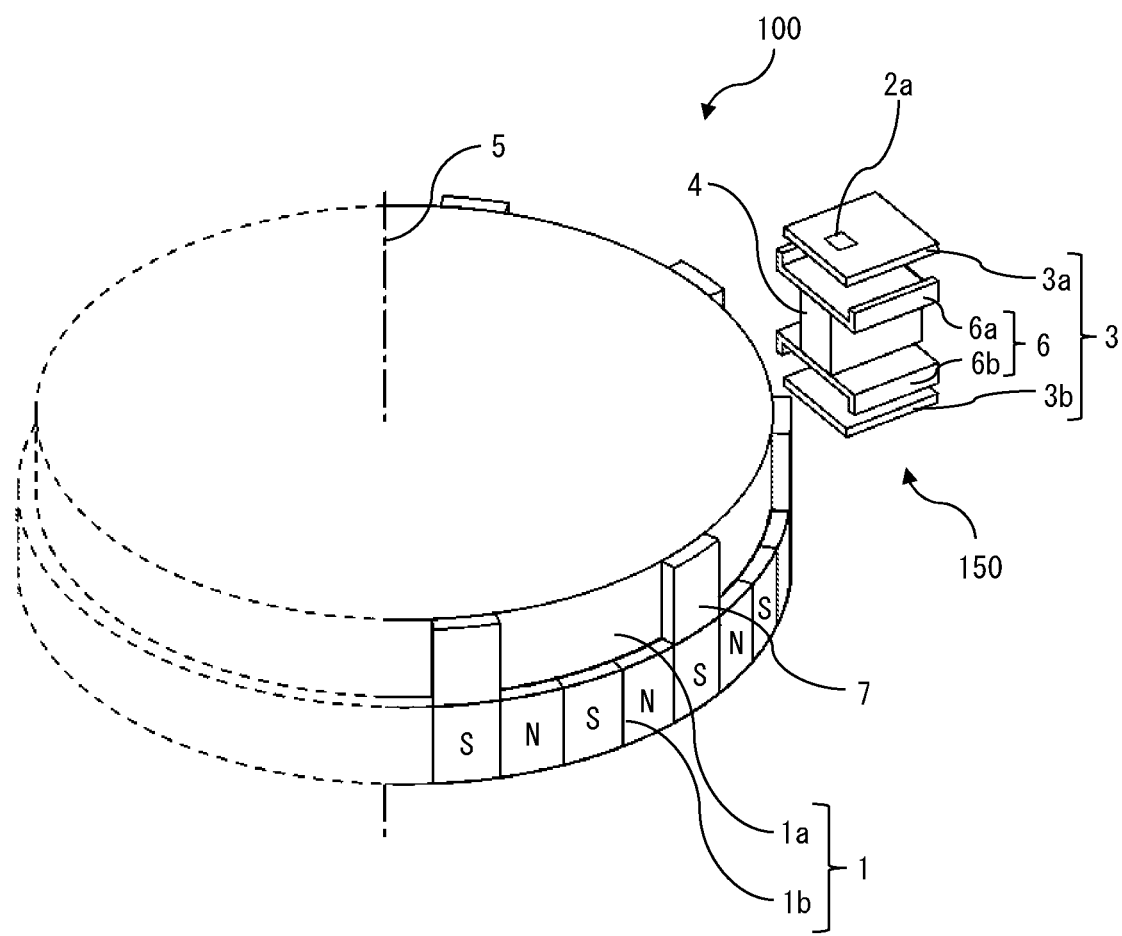
FIG. 18 is a perspective view schematically showing the structure of a magnetic detection device according to the eighth embodiment of the present disclosure.

A magnetic detection device 100 according to the eighth embodiment of the present disclosure will be described. FIG. 18 is a perspective view schematically showing the structure of the magnetic detection device 100 according to the eighth embodiment. The magnetic detection device 100 according to the eighth embodiment is configured to have S poles and N poles alternately arranged in the circumferential direction on the outer circumferential portion of the second magnetic rotary body 1*b* of the magnetic detection device 100 according to the fifth embodiment.

The outer circumferential portion of the first magnetic rotary body 1a has a plurality of protrusions 7 arranged at predetermined intervals in the circumferential direction, and the outer circumferential portion of the second magnetic rotary body 1b has S poles and N poles alternately arranged in the circumferential direction and thus is magnetized to have multiple poles in a ring shape. The structure for the outer circumferential portion of the first magnetic rotary body 1a and the outer circumferential portion of the second magnetic rotary body 1b to generate different magnetic fields between the magnet 4 and the respective outer circumferential portions, is not limited to the structure in which the plurality of protrusions 7 are arranged at predetermined intervals in the circumferential direction as shown in the above embodiments. The structure for the outer circumferential portion of the first magnetic rotary body 1a and the outer circumferential portion of the second magnetic rotary body 1b to cause different magnetic fields between the magnet 4 and the respective outer circumferential portions, may be the structure in which the outer circumferential portion of the magnetic rotary body 1 has S poles and N poles alternately arranged in the circumferential direction. In the magnetic rotary body 1 having the plurality of protrusions 7, a magnetic material such as iron is used as the plurality of protrusions 7, and therefore the weight of the magnetic rotary body 1 tends to be large. In the magnetic rotary body 1 having S poles and N poles alternately arranged in the circumferential direction, rubber magnets or the like can be used on the outer circumferential portion thereof, and thus the weight of the magnetic rotary body 1 can be reduced.

Here, only the outer circumferential portion of the second magnetic rotary body 1b has S poles and N poles alternately arranged in the circumferential direction and thus is magnetized to have multiple poles in a ring shape, but another configuration may be adopted. The outer circumferential portion of the first magnetic rotary body 1a and the outer circumferential portion of the second magnetic rotary body 1b may each have S poles and N poles alternately arranged in the circumferential direction, and the S poles and the N poles of the first magnetic rotary body 1a and the S poles and the N poles of the second magnetic rotary body 1b may be located at positions different from each other in the circumferential direction or located so as to have widths different from each other in the circumferential direction. Since rubber magnets or the like can be used for both of the outer circumferential portion of the first magnetic rotary body 1a and the outer circumferential portion of the second magnetic rotary body 1b, the weight of the magnetic rotary body 1 can be further reduced.

As described above, in the magnetic detection device 100 according to the eighth embodiment, the outer circumferential portion of the first magnetic rotary body 1a has the plurality of protrusions 7 arranged at predetermined intervals in the circumferential direction, and the outer circumferential portion of the second magnetic rotary body 1b has S poles and N poles alternately arranged in the circumferential direction. Therefore, through rotation of the first magnetic rotary body 1a and the second magnetic rotary body 1b, the outer circumferential portion of the first magnetic rotary body 1a and the outer circumferential portion of the second magnetic rotary body 1b can easily change magnetic fields between the magnet 4 and the respective outer circumferential portions. In addition, the outer circumferential portion of the first magnetic rotary body 1a and the outer circumferential portion of the second magnetic rotary body 1b have different forms. Therefore, through rotation of the first magnetic rotary body 1a and the second magnetic rotary body 1b, the outer circumferential portion of the first magnetic rotary body 1a and the outer circumferential portion of the second magnetic rotary body 1b can cause differently changing magnetic fields between the magnet 4 and the respective outer circumferential portions. In addition, since the outer circumferential portion of the second magnetic rotary body 1b has S poles and N poles alternately arranged in the circumferential direction, the second magneto-resistive element 2b can accurately detect change in the magnetic field due to the second magnetic rotary body 1b. In addition, in the case where rubber magnets are used on the outer circumferential portion of the second magnetic rotary body 1b, the weight of the second magnetic rotary body 1b can be reduced. The form of the outer circumferential portion of each magnetic rotary body 1 can be selected from both of the case of having protrusions 7 and the case of being magnetized to have multiple poles. Therefore, constraints on the layout on the vehicle side can be relaxed. In addition, the lead time in designing can be shortened and thus the vehicle can be manufactured at low cost.

Ninth Embodiment

A magnetic detection device 100 according to the ninth embodiment of the present disclosure will be described. The magnetic detection device 100 according to the ninth embodiment is configured such that a giant magneto-resistive element (hereinafter, referred to as GMR element) of a magnetic field intensity detection type is used as the magneto-resistive element 2 in the magnetic detection device 100 according to any of the first to eighth embodiments.

The first magneto-resistive element 2a and the second magneto-resistive element 2b are GMR elements. The GMR element is formed from a laminate in which magnetic layers and nonmagnetic layers having a thickness of several Å to several tens of Å are alternately arranged, i.e., a so-called artificial lattice film. The GMR element has a significantly great MR effect (MR change rate) as compared to the magneto-resistive element (MR element), and has characteristic of changing its resistance depending on the intensity of a magnetic field in the laminated surface. Using GMR elements as the magneto-resistive elements 2 enables accurate detection for change in the magnetic field due to each of the first magnetic rotary body 1a and the second magnetic rotary body 1b. Even when GMR elements are used as the first magneto-resistive element 2a and the second magneto-resistive element 2b, the size of the magnetic detection device 100 is not increased.

As described above, in the magnetic detection device 100 according to the ninth embodiment, GMR elements are used as the first magneto-resistive element 2a and the second magneto-resistive element 2b. Therefore, while size increase in the magnetic detection device 100 is suppressed, changes in the magnetic fields due to the first magnetic rotary body 1a and the second magnetic rotary body 1b can be accurately detected.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 magnetic rotary body
1a first magnetic rotary body
1b second magnetic rotary body
2 magneto-resistive element
2a first magneto-resistive element
2b second magneto-resistive element
3 processing circuit
3a first processing circuit
3b second processing circuit
4 magnet
4a center axis
4b center point
5 rotation shaft
6 magnetic guide
6a first magnetic guide
6b second magnetic guide
7 protrusion
8 protruding portion
9 plane
21a first magnetic rotary body
21b second magnetic rotary body
100 magnetic detection device
150 detection unit
200 magnetic detection device
201 detection unit
300 magnetic detection device

What is claimed is:

1. A magnetic detection device comprising:
a first magnetic rotary body which rotates about a rotation shaft and has an outer circumferential portion which is a magnetic body;
a second magnetic rotary body which is provided on one side in an axial direction with respect to the first magnetic rotary body and rotates integrally with the first magnetic rotary body, the second magnetic rotary body having an outer circumferential portion which is a magnetic body;
a magnet provided radially outward of the first magnetic rotary body and the second magnetic rotary body and fixed to a non-rotary member, the magnet having a magnetization direction along the axial direction;
a first magneto-resistive element which is provided on another side in the axial direction of the magnet and detects change in a magnetic field;
a second magneto-resistive element which is provided on one side in the axial direction of the magnet and detects change in a magnetic field;
a first magnetic guide provided between the magnet and the first magneto-resistive element; and
a second magnetic guide provided between the magnet and the second magneto-resistive element, wherein
the outer circumferential portion of the first magnetic rotary body and the outer circumferential portion of the second magnetic rotary body cause different magnetic fields between the magnet and the respective outer circumferential portions, wherein the first magnetic guide has two protruding portions protruding from both sides in a circumferential direction toward the other side in the axial direction,
the second magnetic guide has two protruding portions protruding from both sides in the circumferential direction toward the one side in the axial direction, and
the first magnetic guide and the second magnetic guide formed in the same shape and the first magneto-resistive element and the second magneto-resistive element having the same shape are arranged symmetrically in the axial direction with respect to the magnet.

2. The magnetic detection device according to claim 1, wherein
the outer circumferential portion of the first magnetic rotary body and the outer circumferential portion of the second magnetic rotary body each have a plurality of protrusions arranged at predetermined intervals in a circumferential direction, and
the plurality of protrusions of the first magnetic rotary body and the plurality of protrusions of the second magnetic rotary body are arranged at positions different from each other in the circumferential direction.

3. The magnetic detection device according to claim 1, wherein
the outer circumferential portion of the first magnetic rotary body and the outer circumferential portion of the second magnetic rotary body each have S poles and N poles alternately arranged in a circumferential direction, and
the S poles and the N poles of the first magnetic rotary body, and the S poles and the N poles of the second magnetic rotary body, are located at positions different from each other in the circumferential direction or located so as to have widths different from each other in the circumferential direction.

4. The magnetic detection device according to claim 1, wherein
the first magnetic rotary body and the second magnetic rotary body are arranged so as to be spaced from each other in the axial direction.

5. The magnetic detection device according to claim 4, wherein
the first magnetic rotary body and the second magnetic rotary body are formed in cylindrical shapes about the rotation shaft.

6. The magnetic detection device according to claim 5, wherein
an axial-direction center position between the first magnetic rotary body and the second magnetic rotary body, and an axial-direction center position of the magnet, coincide with each other in the axial direction.

7. The magnetic detection device according to claim 6, wherein
an axial-direction interval between the first magnetic rotary body and the second magnetic rotary body is equal to or greater than 1.8 times an axial-direction length of the magnet.

8. The magnetic detection device according to claim 1, wherein
diameters of the first magnetic rotary body and the second magnetic rotary body are different from each other.

9. The magnetic detection device according to claim 1, wherein
a radial-direction length of the first magnetic guide is greater than a radial-direction length of the first magneto-resistive element, and a radial-direction length of the second magnetic guide is greater than a radial-direction length of the second magneto-resistive element.

10. The magnetic detection device according to claim 1, wherein
the first magnetic guide and the second magnetic guide are in contact with the magnet.

11. The magnetic detection device according to claim 1, wherein
circumferential-direction lengths of the first magnetic guide and the second magnetic guide are greater than a circumferential-direction length of the magnet.

12. The magnetic detection device according to claim 1, wherein
circumferential-direction lengths of the first magnetic guide and the second magnetic guide are different from each other.

13. The magnetic detection device according to claim 1, wherein
the first magneto-resistive element and the second magneto-resistive element are giant magneto-resistive elements.

14. A magnetic detection device comprising:
a first magnetic rotary body which rotates about a rotation shaft and has an outer circumferential portion which is a magnetic body;
a second magnetic rotary body which is provided on one side in an axial direction with respect to the first magnetic rotary body and rotates integrally with the first magnetic rotary body, the second magnetic rotary body having an outer circumferential portion which is a magnetic body;
a magnet provided radially outward of the first magnetic rotary body and the second magnetic rotary body and fixed to a non-rotary member, the magnet having a magnetization direction along the axial direction;
a first magneto-resistive element which is provided on another side in the axial direction of the magnet and detects change in a magnetic field;
a second magneto-resistive element which is provided on one side in the axial direction of the magnet and detects change in a magnetic field;
a first magnetic guide provided between the magnet and the first magneto-resistive element; and
a second magnetic guide provided between the magnet and the second magneto-resistive element, wherein
the outer circumferential portion of the first magnetic rotary body and the outer circumferential portion of the second magnetic rotary body cause different magnetic fields between the magnet and the respective outer circumferential portions, wherein
the outer circumferential portion of the first magnetic rotary body has a plurality of protrusions arranged at predetermined intervals in a circumferential direction, and
the outer circumferential portion of the second magnetic rotary body has S poles and N poles alternately arranged in the circumferential direction.

15. The magnetic detection device according to claim 14, wherein
the first magnetic guide has two protruding portions protruding from both sides in a circumferential direction toward the other side in the axial direction, and
the second magnetic guide has two protruding portions protruding from both sides in the circumferential direction toward the one side in the axial direction.

16. The magnetic detection device according to claim 14, wherein
the first magnetic guide and the second magnetic guide formed in the same shape and the first magneto-resistive element and the second magneto-resistive element having the same shape are arranged symmetrically in the axial direction with respect to the magnet.

* * * * *